United States Patent
Chen et al.

(10) Patent No.: US 12,402,386 B2
(45) Date of Patent: Aug. 26, 2025

(54) TRANSISTOR GATE STRUCTURE AND PROCESS

(71) Applicant: Taiwan Semiconductor Manufacturing Co., Ltd., Hsinchu (TW)

(72) Inventors: Hsiu-Ling Chen, Taoyuan (TW); Chih-Teng Liao, Hsinchu (TW); Jen-Chih Hsueh, Kaohsiung (TW); Chen-Wei Pan, Zhubei (TW); Yu-Li Lin, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 459 days.

(21) Appl. No.: 17/824,491

(22) Filed: May 25, 2022

(65) Prior Publication Data

US 2022/0406913 A1  Dec. 22, 2022

Related U.S. Application Data

(60) Provisional application No. 63/212,160, filed on Jun. 18, 2021.

(51) Int. Cl.
| | | |
|---|---|---|
| H10D 64/27 | (2025.01) | |
| H01L 21/28 | (2025.01) | |
| H10D 30/01 | (2025.01) | |
| H10D 30/62 | (2025.01) | |
| H10D 64/01 | (2025.01) | |
| H10D 64/66 | (2025.01) | |
| H10D 84/01 | (2025.01) | |
| H10D 84/03 | (2025.01) | |
| H10D 84/85 | (2025.01) | |

(52) U.S. Cl.
CPC ......... *H10D 64/518* (2025.01); *H10D 30/024* (2025.01); *H10D 30/62* (2025.01); *H10D 64/017* (2025.01); *H10D 84/853* (2025.01)

(58) Field of Classification Search
CPC .... H10D 30/62; H10D 64/017; H10D 64/518; H10D 84/853; H10D 30/024
See application file for complete search history.

(56) References Cited

U.S. PATENT DOCUMENTS

| | | | |
|---|---|---|---|
| 7,635,632 B2 | 12/2009 | Yeo et al. | |
| 9,105,719 B2 | 8/2015 | Ito | |
| 9,620,417 B2 | 4/2017 | Chen et al. | |
| 2015/0115363 A1* | 4/2015 | Chang | H01L 27/1211 257/347 |

(Continued)

FOREIGN PATENT DOCUMENTS

| | | |
|---|---|---|
| TW | 200601593 A | 1/2006 |
| TW | 201428977 A | 7/2014 |

(Continued)

*Primary Examiner* — Changhyun Yi
(74) *Attorney, Agent, or Firm* — Slater Matsil, LLP

(57) ABSTRACT

Embodiments include methods and devices which utilize dummy gate profiling to provide a profile of a dummy gate which has narrowing in the dummy gate. The narrowing causes a neck in the dummy gate. When the dummy gate is replaced in a gate replacement process, the necking provides control of an etch-back process. Space is provided between the replacement gate and a subsequently formed self-aligned contact.

20 Claims, 37 Drawing Sheets

(56) References Cited

U.S. PATENT DOCUMENTS

2019/0371915 A1    12/2019  Liao et al.
2022/0336653 A1    10/2022  Wang et al.

FOREIGN PATENT DOCUMENTS

TW    201612972 A    4/2016
TW    202004864 A    1/2020
TW    202107710 A    2/2021

* cited by examiner

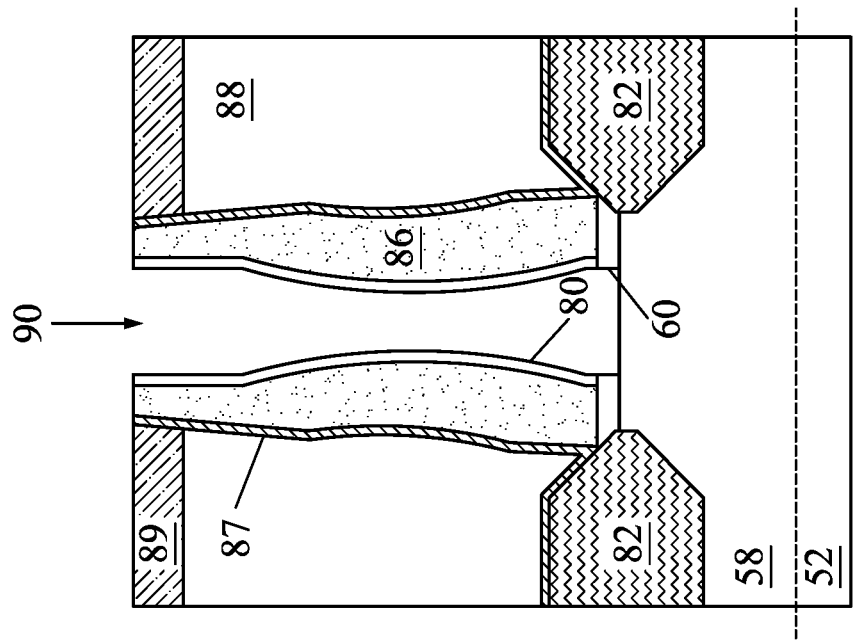
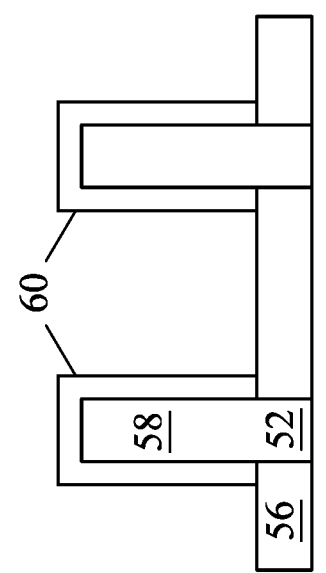
Figure 19B
Figure 19A

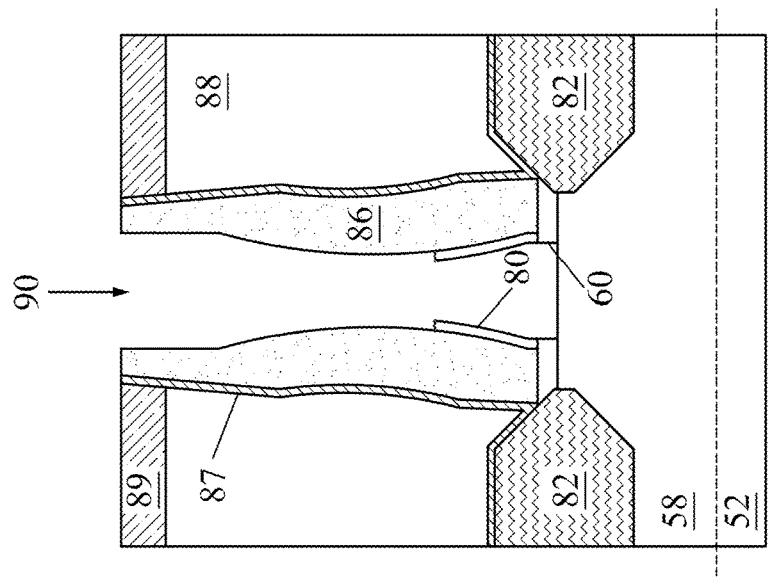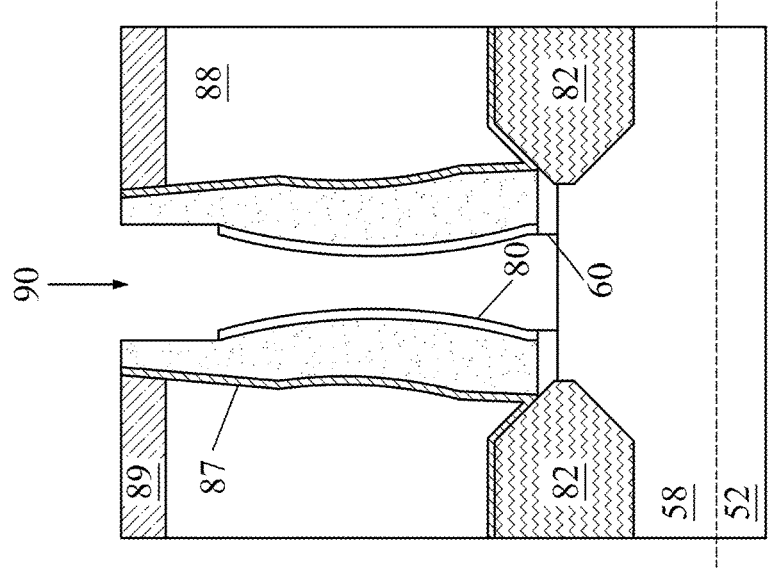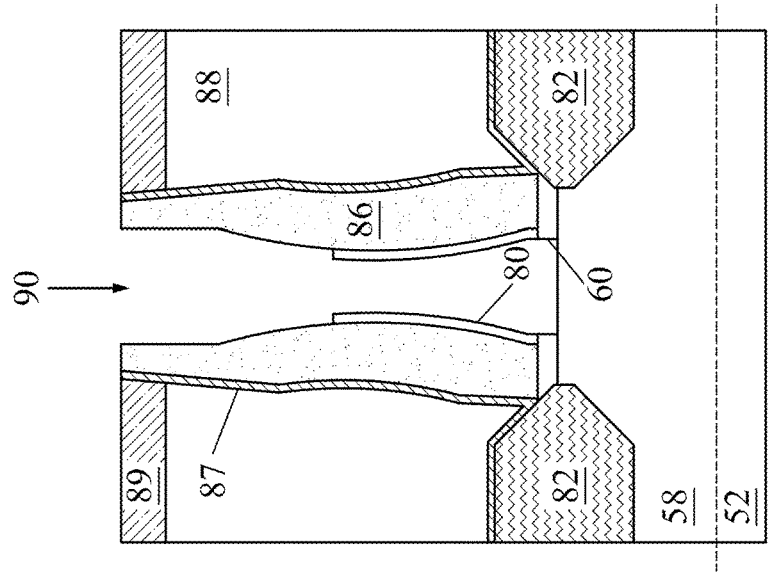

TRANSISTOR GATE STRUCTURE AND PROCESS

PRIORITY CLAIM AND CROSS-REFERENCE

This application claims the benefit of U.S. Provisional Application No. 63/212,160, filed on Jun. 18, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 8A, 8B, 9, 10, 11A, 11B, 14A, 14B, 15A, 15B, 16A, 16B, 16C, 16D, 17A, 17B, 18A, 18B, 19A, 19B, 20A, 20B, 20C, 21A, 21B, 22A, 22B, 23A, 23B, 25A, 25B, 28A, 28B, 29A, 29B, 30, 31, 32A, 32B, 33A, and 33B are cross-sectional views of intermediate stages in the manufacturing of FinFETs, in accordance with some embodiments.

DETAILED DESCRIPTION

Figure 1:
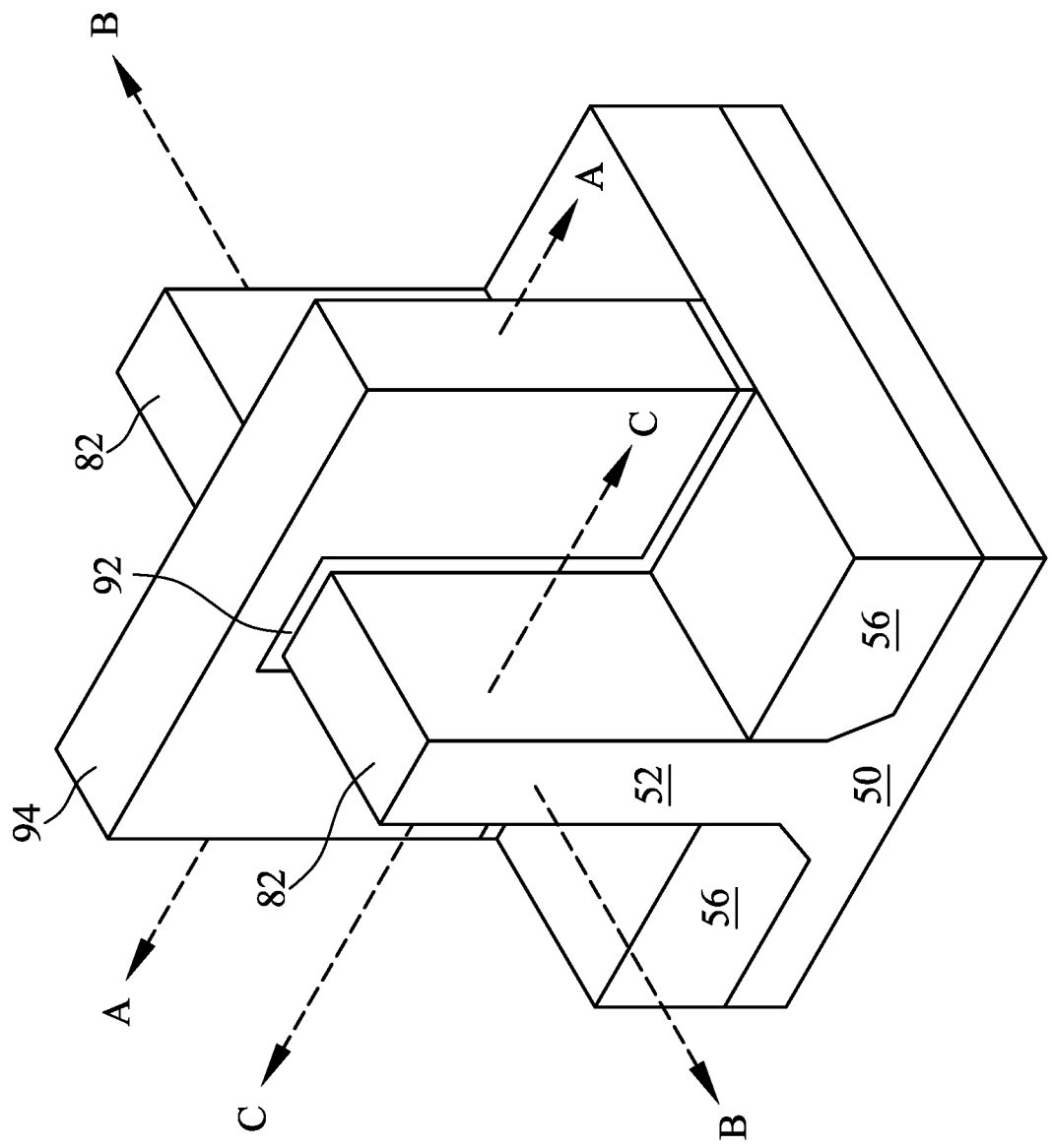
FIG. 1 illustrates an example of a FinFET in a three-dimensional view, in accordance with some embodiments.

The following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Tuning voltage thresholds of transistor devices is desirable for providing multiple threshold voltage device regions on a single device substrate. Threshold voltages may be tuned by manipulating the work function layers of the gate stacks. To form a self-aligned contact, the gate stacks are recessed to provide a large buffer between the gate stacks and the self-align etch. However, because the different device regions may have different work function layers, the etch rates when etching the gate stack back may vary enough to cause either shorting issues (not enough etching) or fin damage (too much etching). Embodiments advantageously alter the dummy gate profile, and thereby alter the replacement gate profile to provide a necking portion of the dummy gate. When etching back the replacement metal gates, the necking portion causes the etch rates to slow down and provides a more uniform gate height, thereby reducing the risk of shorts between the gate electrode and the source/drain contact and reducing the risk of fin damage when etching back the gate stack.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 (e.g., source regions and/or drain regions) are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 11B, 14A through 25B, and 28A through 33B include cross-sectional views of intermediate stages in the manufacturing of FinFETs, in accordance with some embodiments. FIGS. 2 through 7A, 8A, 11A, 14A, 15A, 16A, 17A, 18A, 19A, 21A, 22A, 23A, 25A, 28A, 29A, 32A, and 33A are illustrated along reference cross-section A-A illustrated in FIG. 1, except for multiple fins/FinFETs. FIGS. 8B, 9, 10, 11B, 13A, 13B, 13C, 13D, 14B, 15B, 16B, 17B, 18B, 19B, 20A, 20B, 20C, 21B, 22B, 23B, 25B, 28B, 29B, 30, 31, 32B, 33B are illustrated along a similar cross-section B-B illustrated in FIG. 1, except for multiple fins/FinFETs. FIGS. 16C and 16D are illustrated along reference cross-section C-C illustrated in FIG. 1, except for multiple fins/FinFETs.

Figure 2:
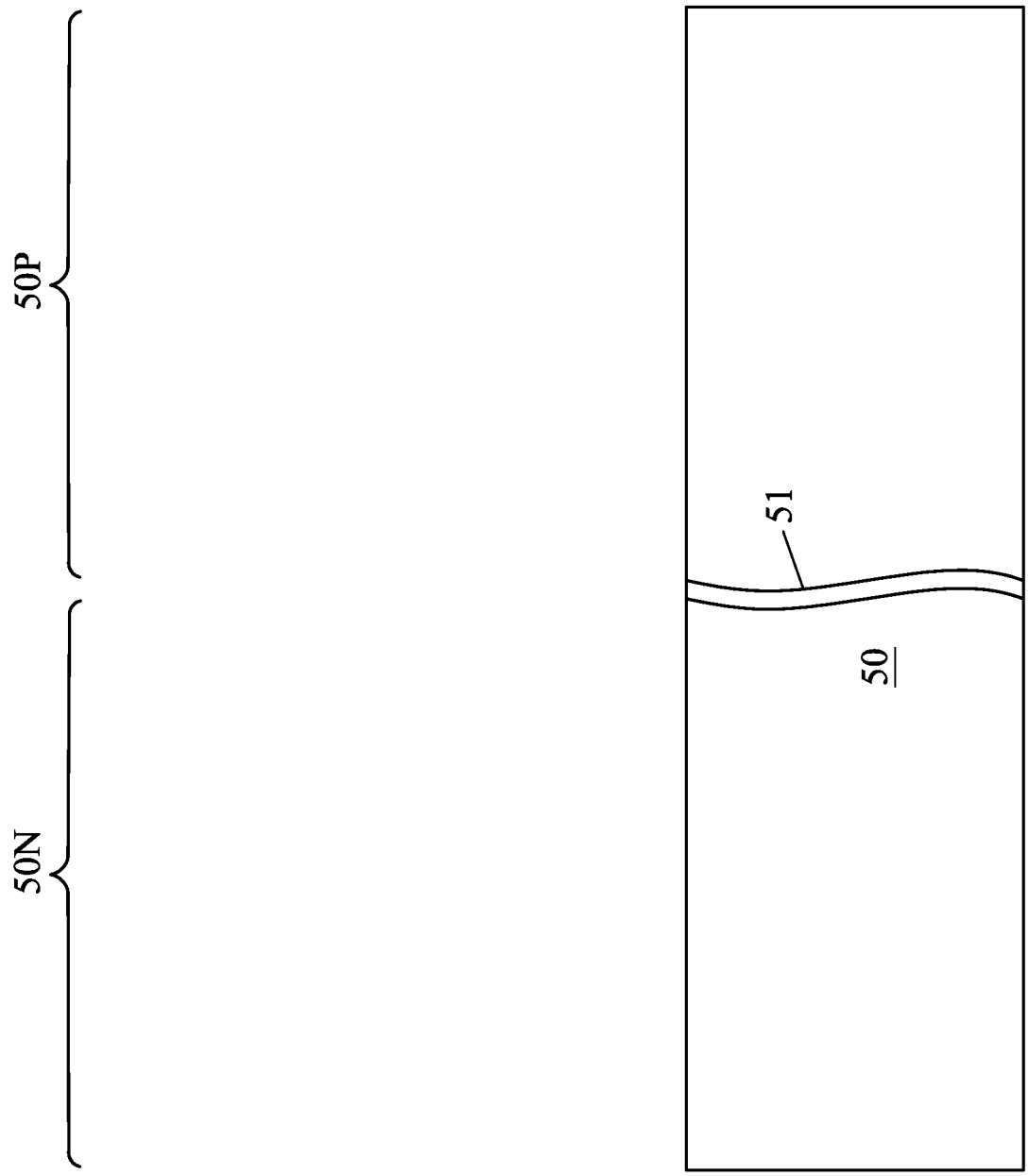

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P. The substrate may also have device regions 50A, 50B, 50C, and 50D, which may be subsets of the n-type region 50N and/or p-type region 50P. For example, the n-type region 50N may include one or more device regions 50A, 50B, 50C, or 50D, and the p-type region 50P may include one or more device regions 50A, 50B, 50C, or 50D. The device regions 50A, 50B, 50C, and 50D denote regions where the gate is tuned to have unique threshold voltages, such as will be discussed with respect to FIGS. 24A, 24B, 24C, and 24D.

Figure 3:
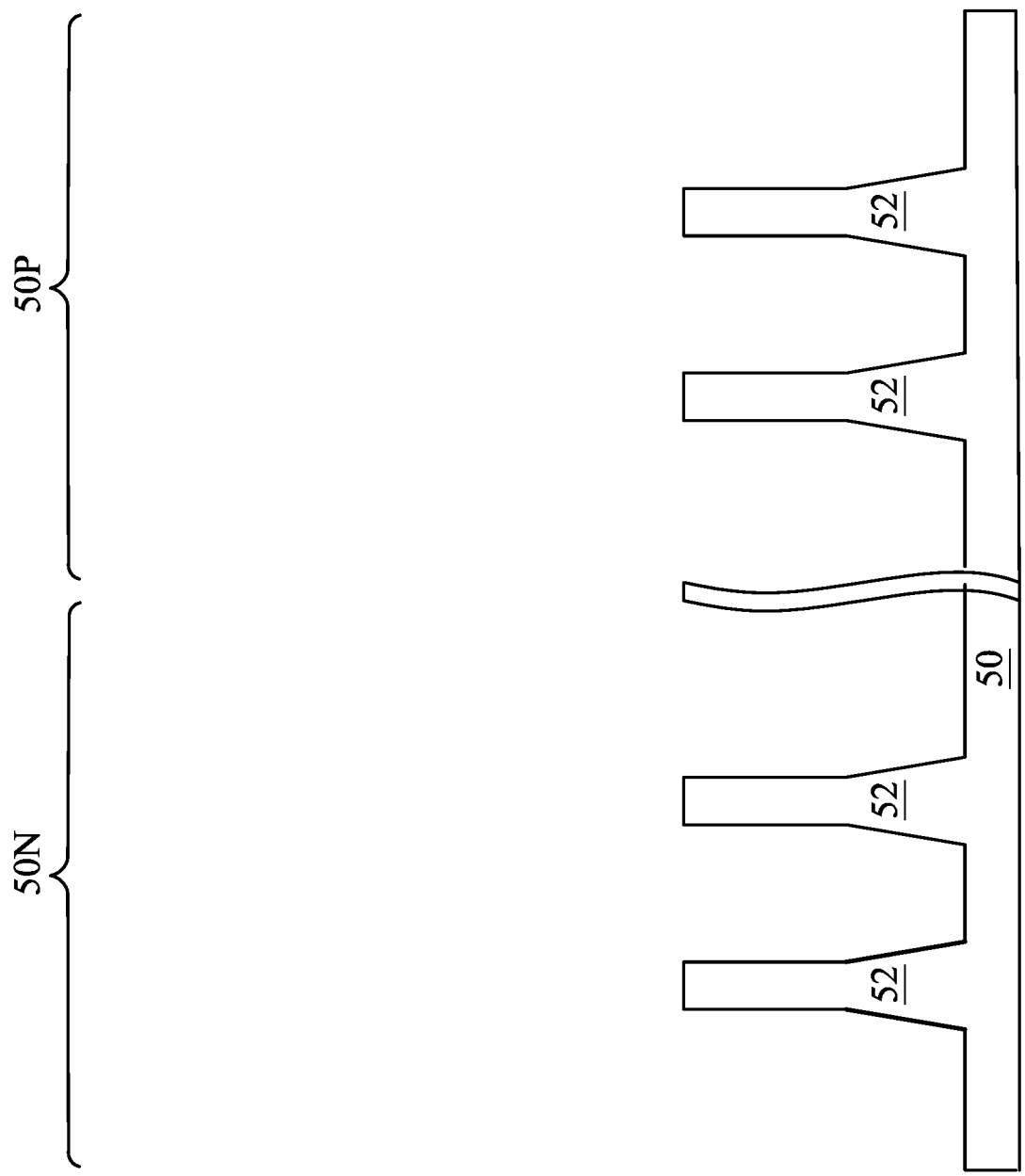

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
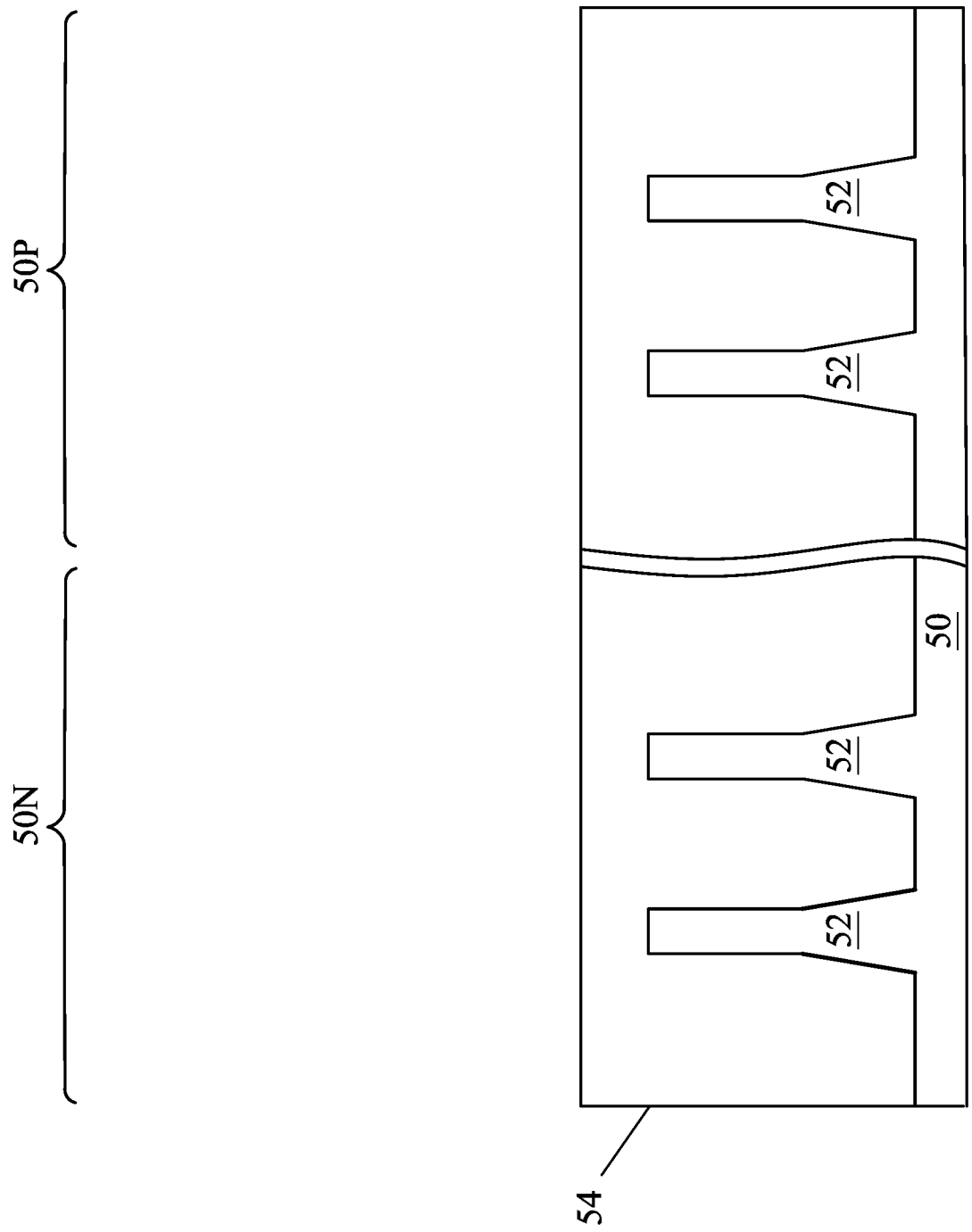

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
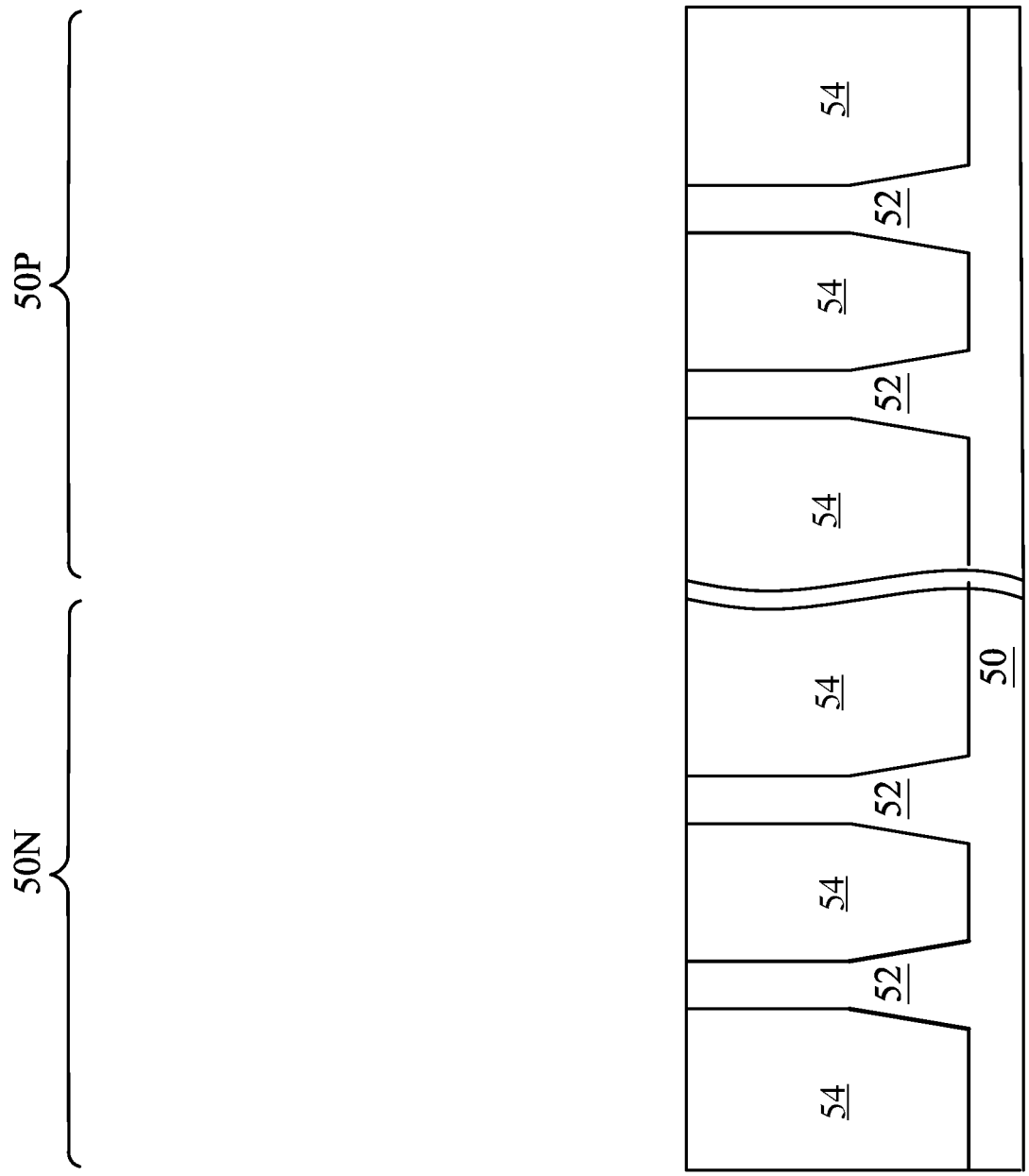

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
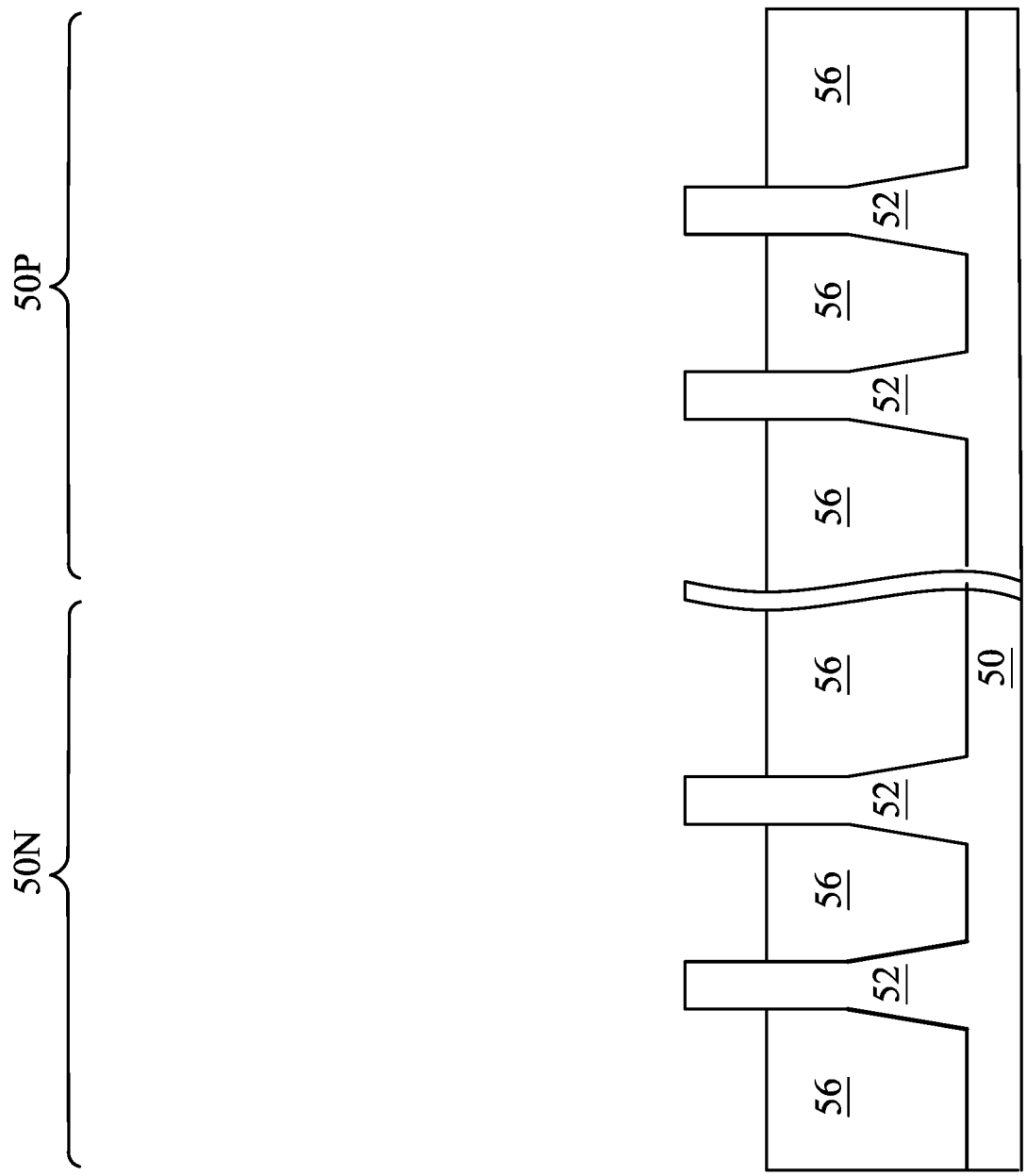

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$), where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7A:
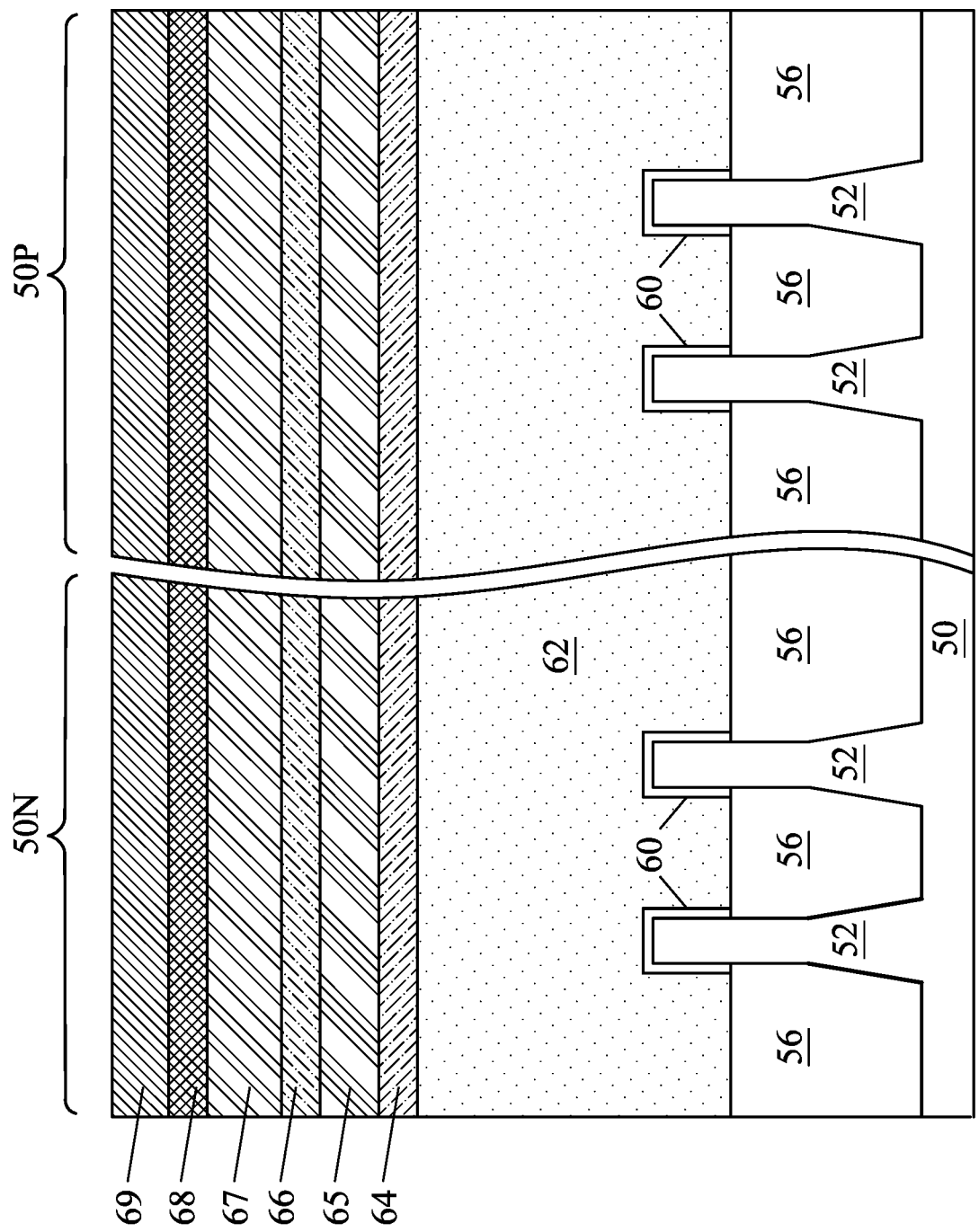
Figure 7B:
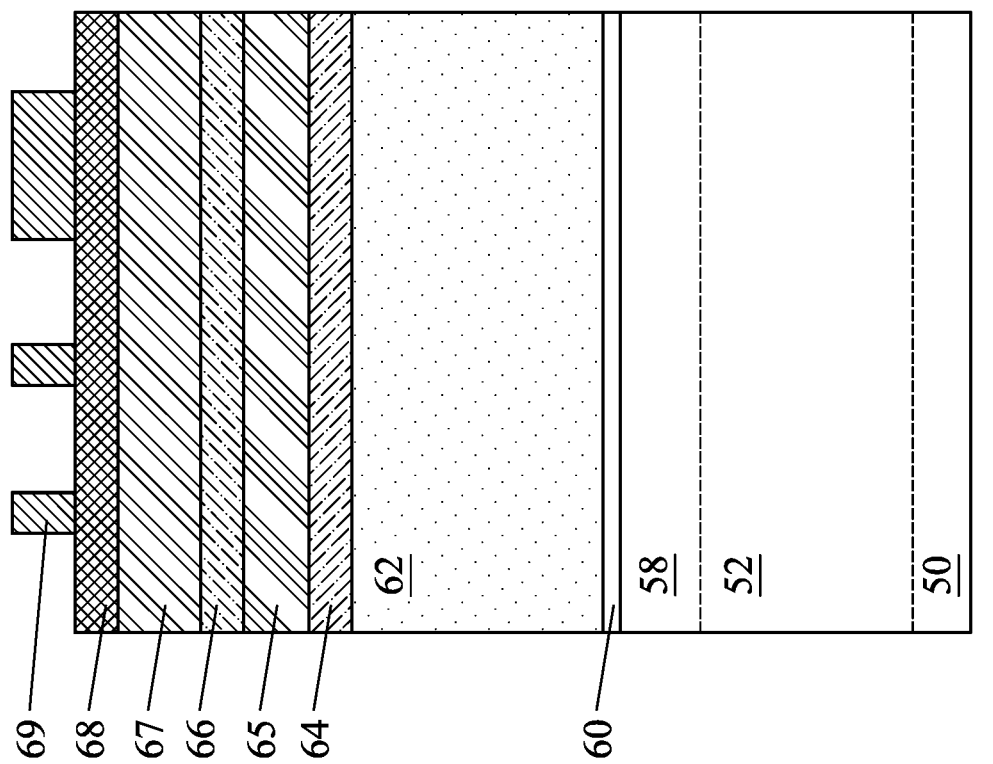

In FIGS. 7A and 7B, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

In the example illustrated in FIGS. 7A and 7B, several other layers are provided over the mask layer 64 for purposes of patterning. The padding layer 65 may include one or more layers of, for example, silicon oxide, silicon oxynitride, aluminum oxide, or the like, and may be deposited by any suitable process, such as by PVD, CVD, sputter deposition or other techniques for depositing the selected material. A second mask layer 66 is provided over the padding layer 65, which may include one or more layers of, for example, silicon nitride, silicon oxynitride, or the like, deposited by physical vapor deposition (PVD), CVD, sputter deposition, or other techniques for depositing the selected material. The bottom layer 67, middle layer 68, and top layer 69 are layers of a tri-layer photo patterning mask. Each of these layers may be deposited in succession using suitable deposition processes for each one. In accordance with some embodiments of the present disclosure, the bottom layer 67 and top layer 69 are formed of photo resist materials, which are formed of organic materials. The middle layer 68 may be formed of an inorganic material, which may be a nitride (such as silicon nitride), an oxynitride (such as silicon oxynitride), an oxide (such as silicon oxide), or the like. The middle layer 68 has a high etching selectivity with relative to the top layer 69 and the bottom layer 67, and hence the top layer 69 is used as an etching mask for the patterning of the middle layer 68, and the middle layer 68 is used as an etching mask for the patterning of the bottom layer 67. Each of these layers may be deposited by a deposition technique suitable to the material selected for the layer, such as by PVD, CVD, sputtering, spin coating, and so forth.

In FIG. 7B, the top layer 69 is exposed to a light pattern and the pattern is fixed into the photo resist material of the top layer 69. In the example provided, the remaining mask material defines what will become dummy gates, which are then replaced in a gate replacement process. This process will be described in greater detail below.

FIGS. 8A through 16B illustrate various additional steps in the manufacturing of embodiment devices. FIGS. 8A through 16B illustrate features in either of the n-type region 50N and the p-type region 50P. For example, the structures illustrated in FIGS. 8A through 16B may be applicable to both the n-type region 50N and the p-type region 50P. Differences (if any) in the structures of the n-type region 50N and the p-type region 50P are described in the text accompanying each figure.

Figure 8A:
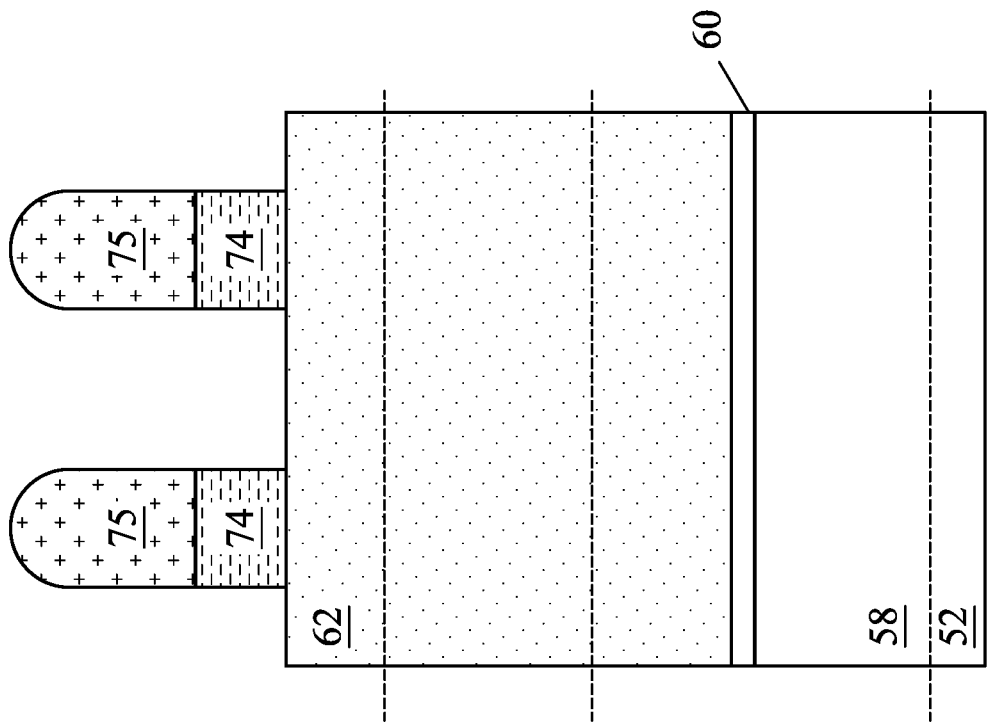
Figure 8B:
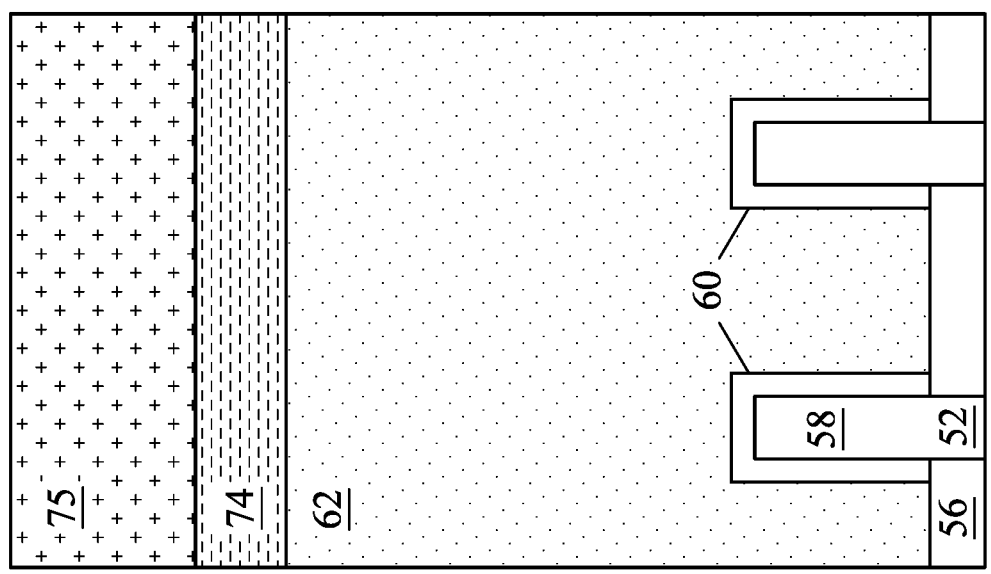

FIGS. 8A and 8B illustrate an enlarged portion of the structure of FIGS. 7A and 7B after a series of etching processes has transferred the pattern of the top layer 69 to the padding layer 65 and mask layer 64 (see FIGS. 7A and 7B), resulting in the paddings 75 and masks 74. The series of etching processes includes performing an etching process to transfer the pattern of the top layer 69 to the middle layer 68, then another etching process using the patterned middle layer 68 as an etch mask to transfer the pattern of the middle layer 68 to the bottom layer 67, then another etching process using the patterned bottom layer 67 as an etch mask to transfer the pattern of the bottom layer 67 to the second mask layer 66. The process of depositing a tri-layer mask and patterning the second mask layer 66 may be repeated any number of times to lock in a pattern for the dummy gates and/or other device features disposed on or in the substrate 50. The etching processes may utilize dry etching techniques using etchant gasses selective to the material layers being etched. The patterned second mask layer 66 is then used as an etch mask to transfer the pattern of the second mask layer 66 to the padding layer 65 and the mask layer 64 to form the paddings 75 and masks 74. In each of the etching processes, the mask layer may be consumed by the etching process or may be removed by a subsequent etching or ashing process, depending on the material being removed.

FIGS. 9, 10, 11A, and 11B illustrate continued etching processes on the dummy gate layer 62. In some embodiments, the dummy gate layer 62 is etched in three distinctive processes, each process providing different etching process variables so that the subsequently formed dummy gates 72 have a varying cross-sectional width. As will be discussed with respect to FIGS. 13A through 13D, the dummy gates 72 may have several different configurations, depending on the desired characteristics of the subsequently formed replacement metal gates. Providing customized dummy gates 72 with varying cross-sectional widths provides the ability to perform a more reliable etch back when the subsequently formed replacement gates are etched back.

The etching processes 76A, 76B, and 76C may each include a dry etch process using a different ratio of etching plasmas for each of the etching processes 76A, 76B, and 76C. In some embodiments, the etching gasses include a mixture of HBr and $Cl_2$. Adjusting the ratio of HBr to $Cl_2$ provides a different profile result for each stage of the etching processes 76A, 76B, and 76C. HBr plasmas etch more slowly than $Cl_2$ plasmas, at least in part because less halogen is available at the surface from the plasma. Because the size of $Br^+$ ions are bigger than $Cl^+$ ions, the ion flux $Br^+$ is less than the $Cl^+$ and thus provides more etching per atom. A ratio of HBr:$Cl_2$ of about 3:1 provides an even etching result so that an overlying mask layer is well-transferred onto the underlying layer—i.e., the width of the underlying layer is the same as the overlying mask layer. A ratio of HBr:$Cl_2$ of about 1.5:1 causes more lateral etching than the overlying mask layer, so that the etched layer under the overlying mask layer is narrower than the overlying mask layer. A ratio of HBr:$Cl_2$ of about 4:1 causes less lateral etching than the overlying mask layer, so that the etched layer under the overlying mask layer is wider than the overlying mask layer. The gas mixture may be transitioned between various ratios to provide easy transitions between each of the resulting etching profiles.

Figure 9:
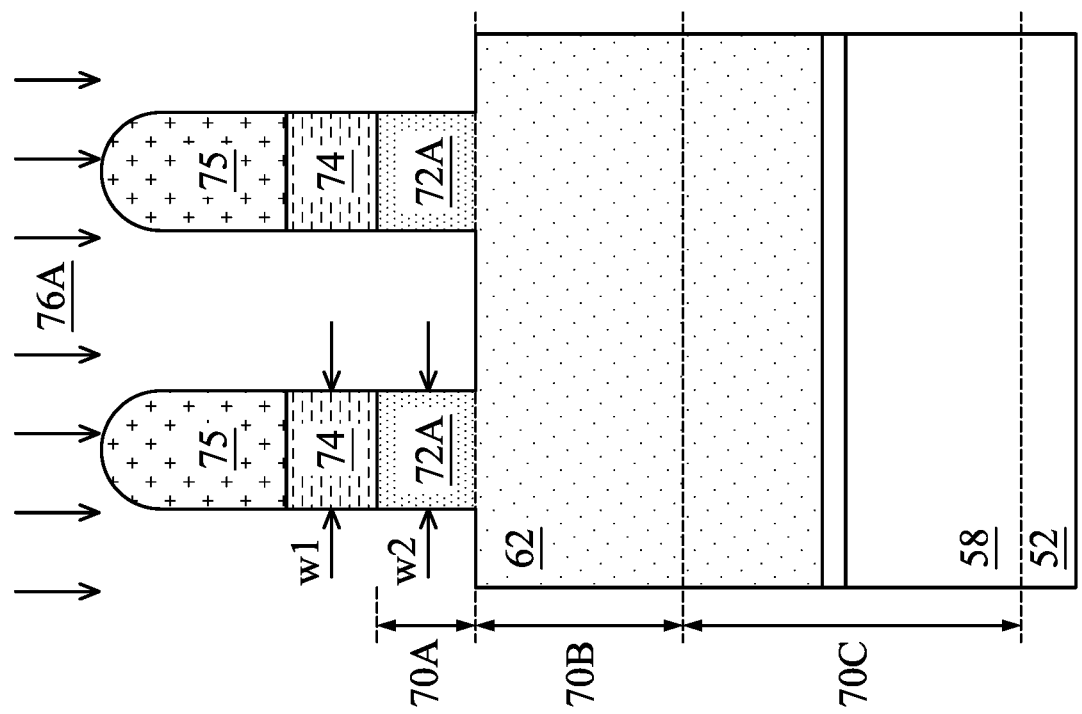

In FIG. 9, the etching process 76A utilizes a ratio of HBr:$Cl_2$ of about 3:1, thereby forming an upper portion 72A of the dummy gates 72 which has about the same width w2 as the width w1 of the mask 74. Thus, the ratio of the width w1 of the mask 74 to width w2 of the upper portion 72A is about 1:1. For example, the width w1 of the mask 74 may be between about 15 and 17 nm and the width w2 of the upper portion 72A may also be between about 15 and 17 nm, though other values are contemplated and may be used. The etching process 76A is performed for a first height 70A of the dummy gates 72. In the illustrated embodiment, the first height 70A also corresponds to the height of the upper portion 72A, the upper portion 72A being a portion of the dummy gate 72 which has about the same width as the mask 74. The dummy gate layer 62 is partially etched to remove the unmasked portions thereof and the remaining portions of the dummy gate layer 62 through the first height 70A correspond to the upper portion 72A of the dummy gates 72. The time for etching the first height 70A may be between about 65 sec and 95 sec. The etching gasses may be provided at a flow rate of between about 70 sccm and 300 sccm and the pressure in the etching chamber may be between about 70 torr and about 90 torr. The etching gasses may be ignited into a plasma by energizing a radio frequency (RF) power source providing an RF signal via an antenna. The frequency of the RF power source may be 13 to 27 kHz.

Figure 10:
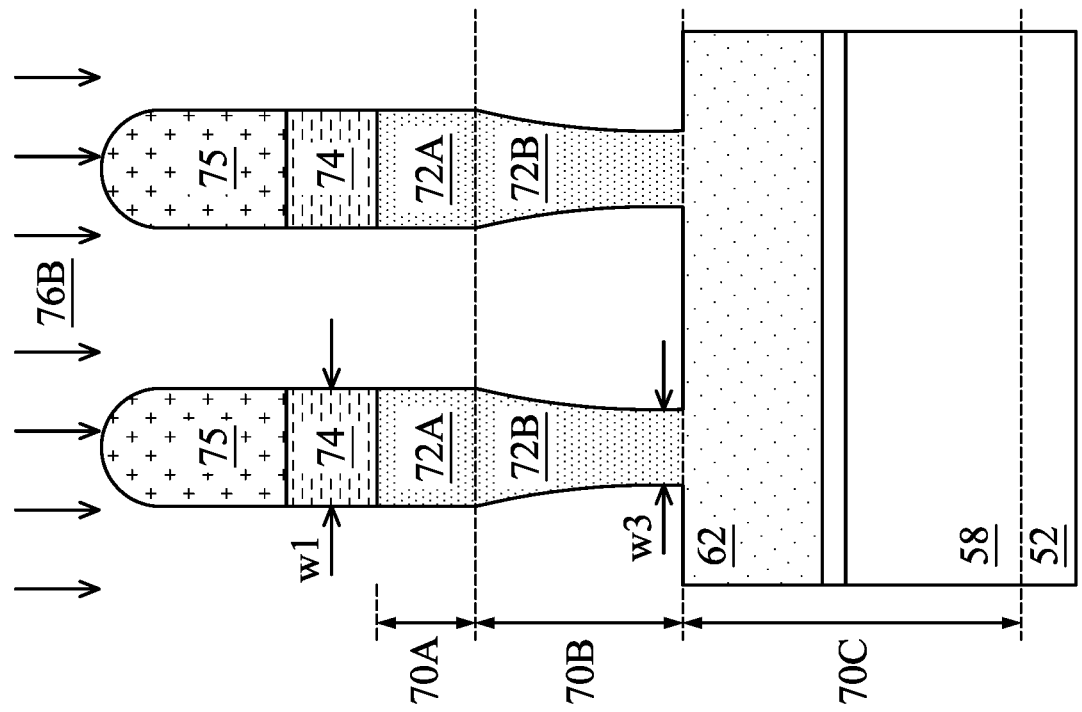

In FIG. 10, the ratio of HBr:$Cl_2$ is decreased from about 3:1 to about 1.5:1 and the etching is continued in a second etching process 76B through a second height 70B of the dummy gate layer 62 to form part of the middle portion 72B of the dummy gate 72. The ratio may be decreased suddenly or gradually over a period of time. The time for etching the second height 70B may be between about 145 sec and 205 sec. In some embodiments, the ratio of HBr:$Cl_2$ may be decreased linearly over a period of time about 10% to 75% of the total etch time of the second height 70B. As the ratio of HBr:Cl$_2$ decreases, the lateral etching of the middle portion 72B increases, causing a necking or narrowing of the middle portion 72B. A ratio of the width w1 of the mask 74 to the width w3 at the narrowest portion of the middle portion may be about 10:9. For example, the width w3 may be between about 14 to 15 nm when the width w1 is between about 15 and 17 nm. Notably, the second height 70B is not necessarily the same height as the height of the middle portion 72B. In the illustrated embodiment, the middle portion 72B is understood to be the portion of the dummy gate 72 which is narrower than the mask 74. When the ratio of the HBr:Cl$_2$ is increased for etching the third height 70C, the width of the middle portion 72B may increase from the width w3 up to and optionally greater than the width w1. In the etching process 76B, the other process variables may be the same or similar to those used in etching process 76A.

Figure 11B:
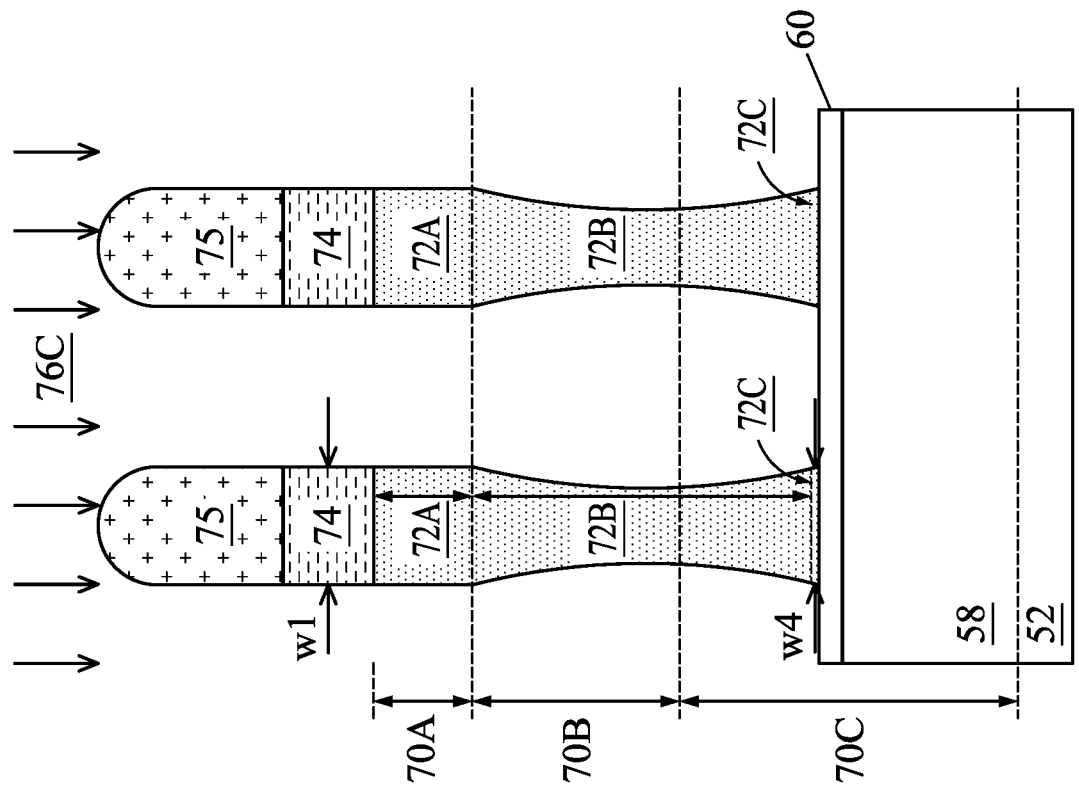
Figure 11A:
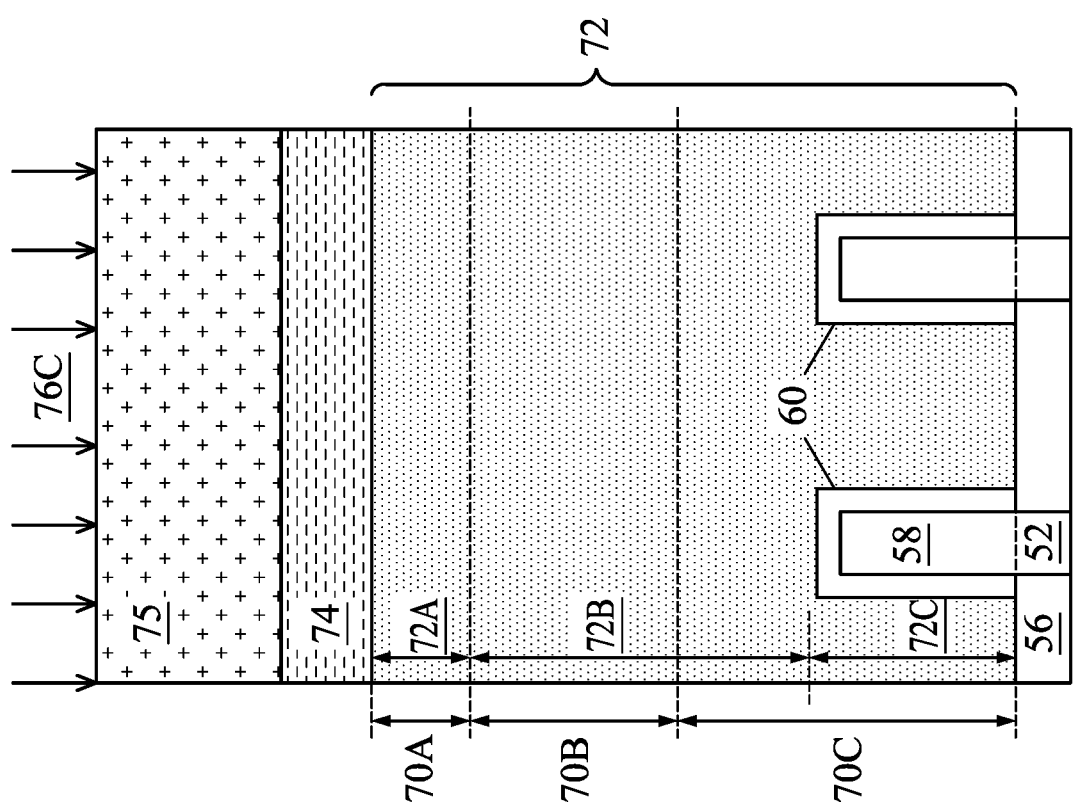

In FIGS. 11A and 11B, the ratio of HBr:Cl$_2$ is increased from about 1.5:1 to between about 3:1 and 4:1, and the etching is continued in a third etching process 76C through the third height 70C of the dummy gate layer 62 to remove the remaining thickness of the dummy gate layer 62 between dummy gates 72, thereby exposing an upper surface of the STI 56 between the dummy gates 72. The time for etching the third height 70C may be between about 125 sec and 185 sec. In some embodiments, the ratio of HBr:Cl$_2$ may be increased linearly over a period of time about 10% to 75% of the total etch time of the third height 70C. As the ratio of HBr:Cl$_2$ increases, the lateral etching of the middle portion 72B decreases, reducing the necking or narrowing of the middle portion 72B until it joins the lower portion 72C.

In some embodiments, the ratio of HBr:Cl$_2$ is increased to about 3:1 and the lower portion 72C has a maximum width w4 which is about the same as the width w1 of the mask 74. In other embodiments, the ratio of HBr:Cl$_2$ is increased to about 4:1 and the width of the lower portion 72C has a maximum width w4 which may be greater than the width w1 of the mask 74. The ratio of the maximum width w4 of the lower portion 72C to the width w1 of the mask may be between about 9:10 and 10:9. For example, the width w4 may be between about 14 nm and about 17.5 nm. When the ratio of HBr:Cl$_2$ is increased to about 3:1, the ratio w4:w1 may be between about 9:10 and 10:10. When the ratio of HBr:Cl$_2$ is increased to about 4:1, the ratio w4:w1 may be between about 10:10 and 10:9.

In some embodiments, in the etching process 76C, the other process variables may be the same or similar to those used in the etching process 76A, however, in other embodiments, the process variables may be changed to provide a gentler etching process than the etching process 76A and 76B. For example, the etchant flow rate may be reduced, the total ion energy reduced, or the like to provide less aggressive etching. Providing a higher ratio of HBr:Cl$_2$ (about 4:1) and/or changing other process variables may be done to increase the etch selectivity of the etching process 76C to reduce damage done to the fins 58, once they are exposed through etching the third height 70C.

Figure 12:
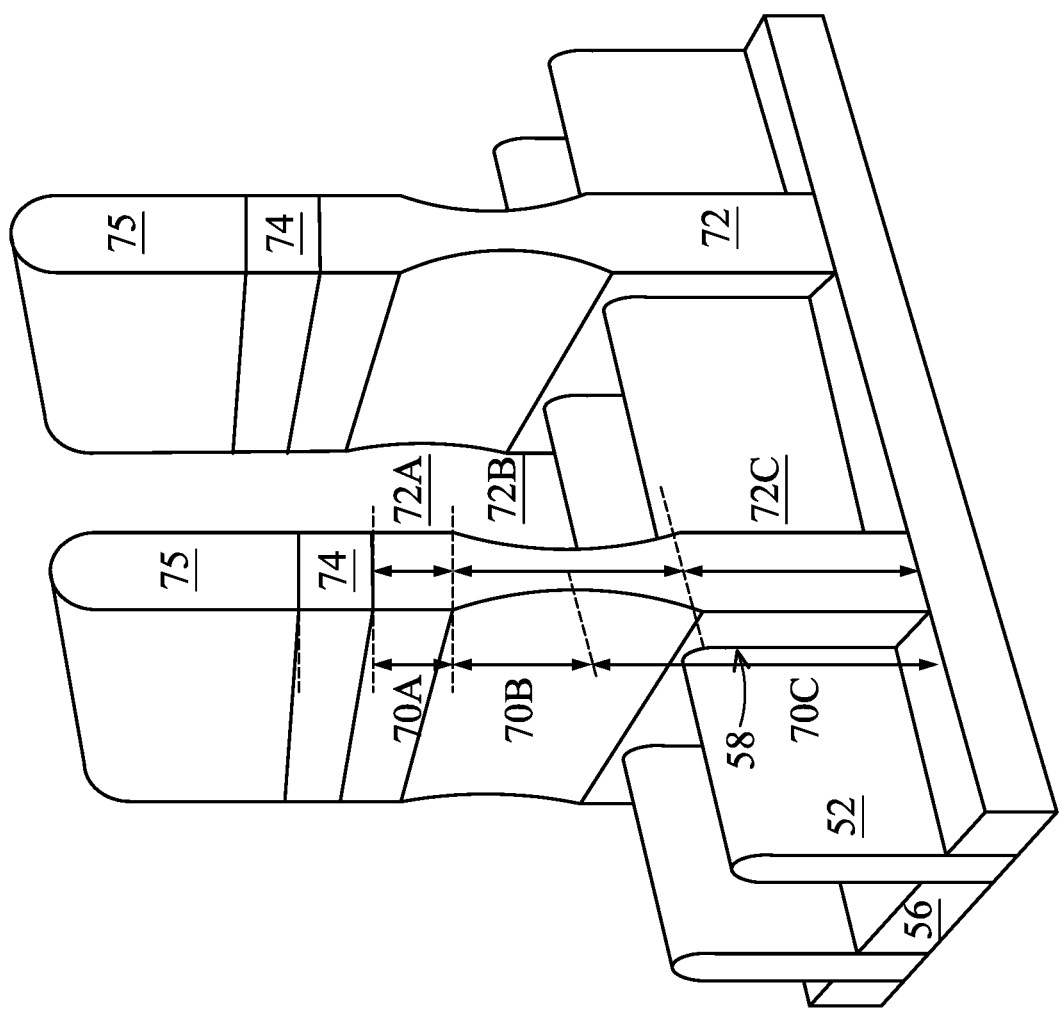
FIG. 12 illustrates a three dimensional view of an intermediate stage in the manufacturing of FinFETs, in accordance with some embodiments.

FIG. 12 illustrates a perspective view of the dummy gates 72 over the fins 52. As illustrated in FIG. 12, the combined etching processes 76A, 76B, and 76C are used to form the dummy gate 72 extending lengthwise perpendicular to the fins 52. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Because the dummy gates 72 have a controlled profile with necking, the etch back process used in the formation of the replacement metal gates can be better controlled, as explained in greater detail below. As a result, when self-aligned contacts are made, then the risk of unwanted shorting is reduced and yield is increased.

FIGS. 13A, 13B, 13C, and 13D illustrate various optional configurations in accordance with some embodiments. The etching processes 76A, 76B, and 76C may be altered to obtain such alternative configurations of the dummy gates 72. Adjacent gates may be made to have different profiles, in accordance with some embodiment. Different profiles of the dummy gates 72 provide a way to control the height of the replacement metal gate during performing an etch back (see FIG. 26) of the replacement metal gate. The distance D1 between the dummy gates 72 is adjustable by altering the etch recipe as noted below. The distance D1 influences the etch rate during the etch back because it is related to the profiles of each of the dummy gates 72. Thus, one can achieve different gate heights by adjusting the profiles of the dummy gates 72, rather than, for example, performing different etch back processes.

Figure 13A:
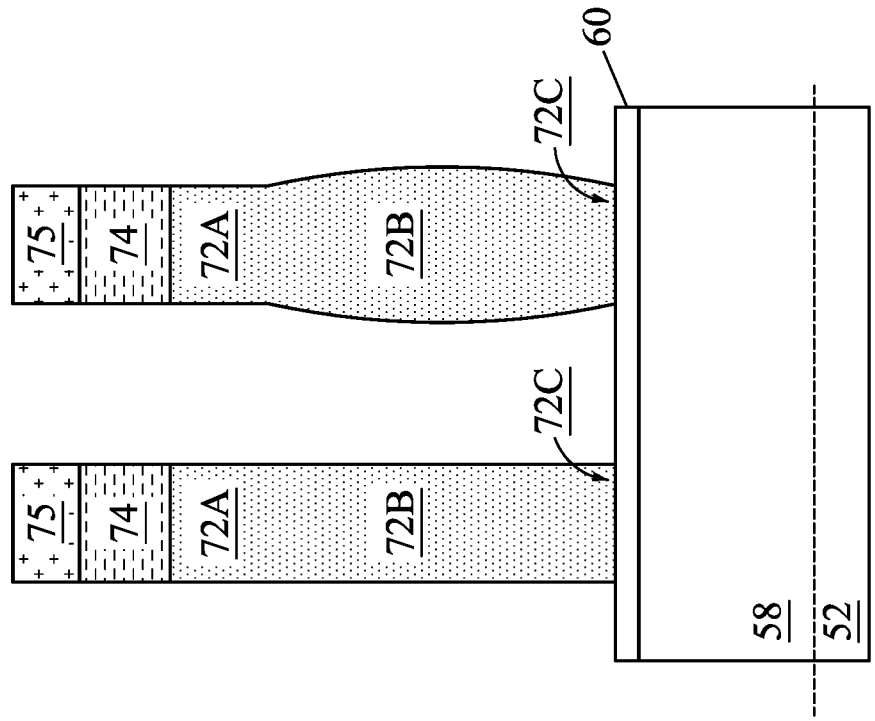
FIGS. 13A, 13B, 13C, and 13D illustrate cross-sectional views of an intermediate stage in the manufacturing of FinFETs, in accordance with some embodiments.

FIG. 13A illustrates that some of the dummy gates 72 may be formed with straight sidewalls and others formed as indicated above. The embodiment illustrated in FIG. 13A may be achieved by masking those areas of the dummy gate layer 62 which are to be etched differently and then altering the etching processes to achieve the desired result. For example, an etching process similar to the etching process 76A may be used for forming the upper portion 72A, middle portion 72B, and lower portion 72C of the left dummy gate 72, while the dummy gate 72 on the right is masked (or while the area of the dummy gate layer 62 corresponding to the dummy gate 72 on the right is masked). In both of the dummy gates 72, the upper portion 72A may be etched in the same etching process (e.g., 76A), and then one or the other of the dummy gate layer 62 masked to form each of the remaining portions of the dummy gates 72 separately.

Figure 13B:
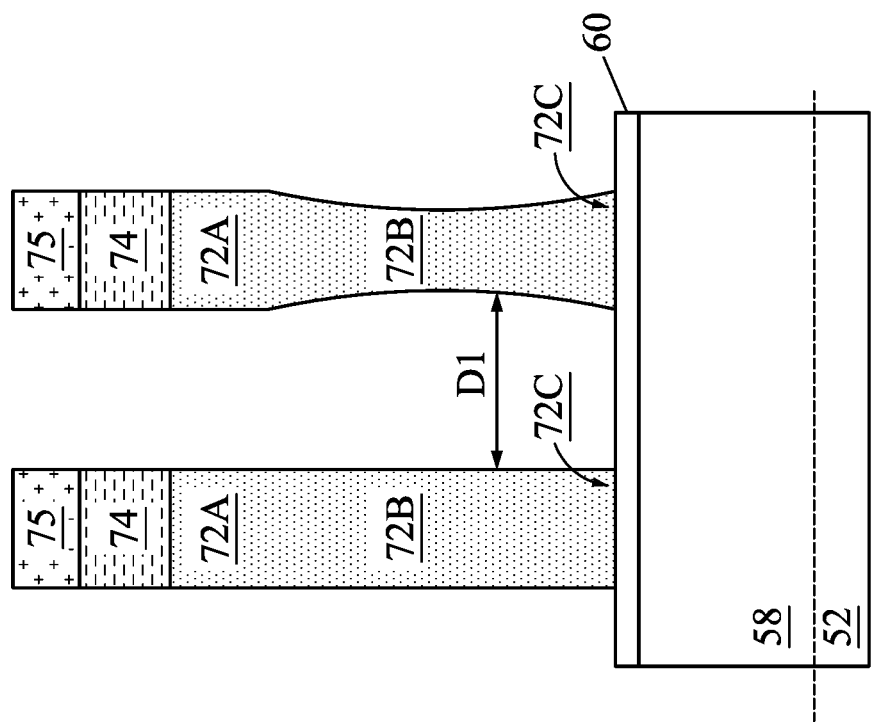

The embodiment illustrated in FIG. 13B may be achieved by performing a process similar to that described above with respect to FIG. 13A (e.g., including masking), except to form the jar shaped dummy gate 72 on the right, the etching process 76B used for etching the second height 70B (see FIG. 10) may be adjusted to have, for example, a ratio HBr:Cl$_2$ of about 4:1.

Figure 13C:
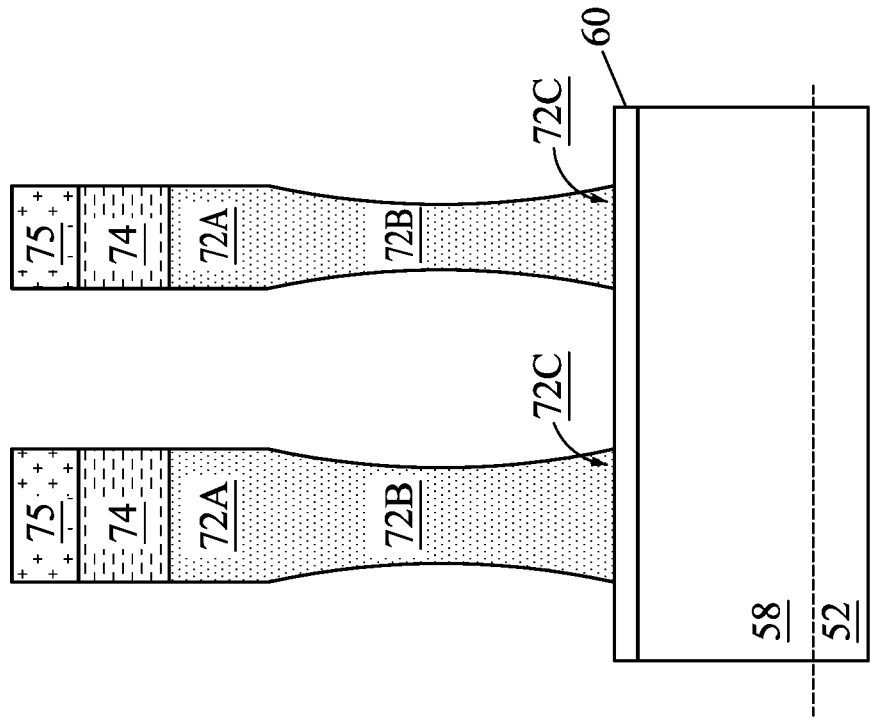

The embodiment illustrated in FIG. 13C may be achieved by performing a process similar to that described above with respect to FIG. 13A (e.g., including masking), except to form necked dummy gates 72 for some of the dummy gates 72 (e.g., on the left) and to form jar shaped dummy gates 72 for other of the dummy gates 72 (e.g., on the right). Similarly, straight walled dummy gates 72 may also be included, such as illustrated in FIG. 13A.

Figure 13D:
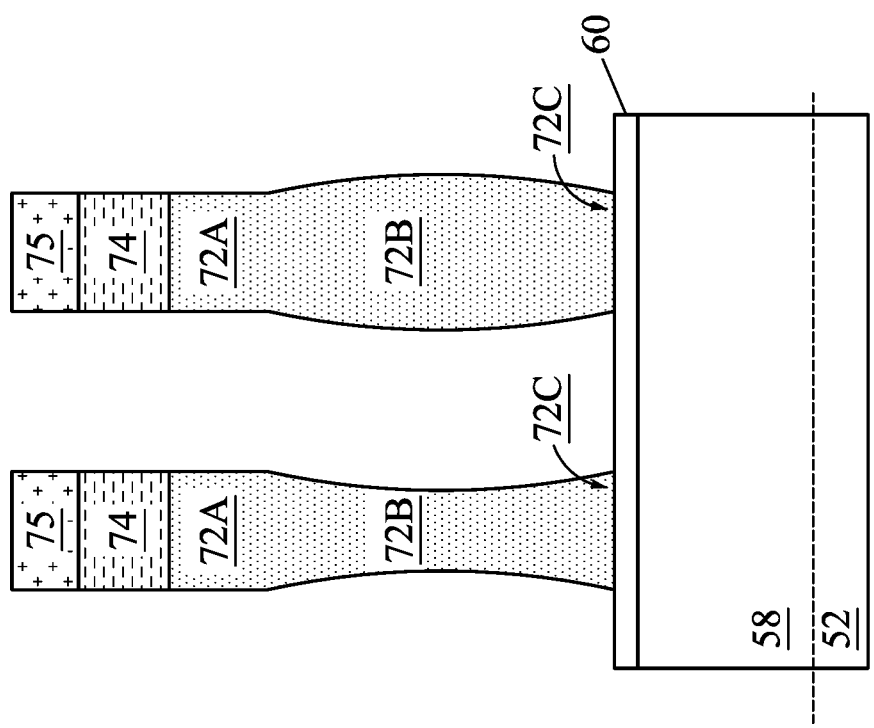

The embodiment illustrated in FIG. 13D demonstrates that dummy gates 72 may also include dummy gates 72 having different widths, depending on the requirements of the device being formed. The different widths may be achieved through the patterning described above with respect to FIGS. 8A and 8B.

It should be understood that the various embodiments illustrated in FIGS. 13A, 13B, 13C, and 13D may be combined without limitation for additional embodiments. For example, some embodiments may include only jar shaped dummy gates 72, some embodiments may include straight walled and jar shaped dummy gates 72, some embodiments may include jar shaped and necked dummy gates 72, some embodiments may include straight walled and necked dummy gates 72, some embodiments may include only necked dummy gates, and some embodiments may include straight walled, necked, and jar shaped dummy gates 72. In all such combinations, the dummy gates 72 may have various widths.

Figure 14B:
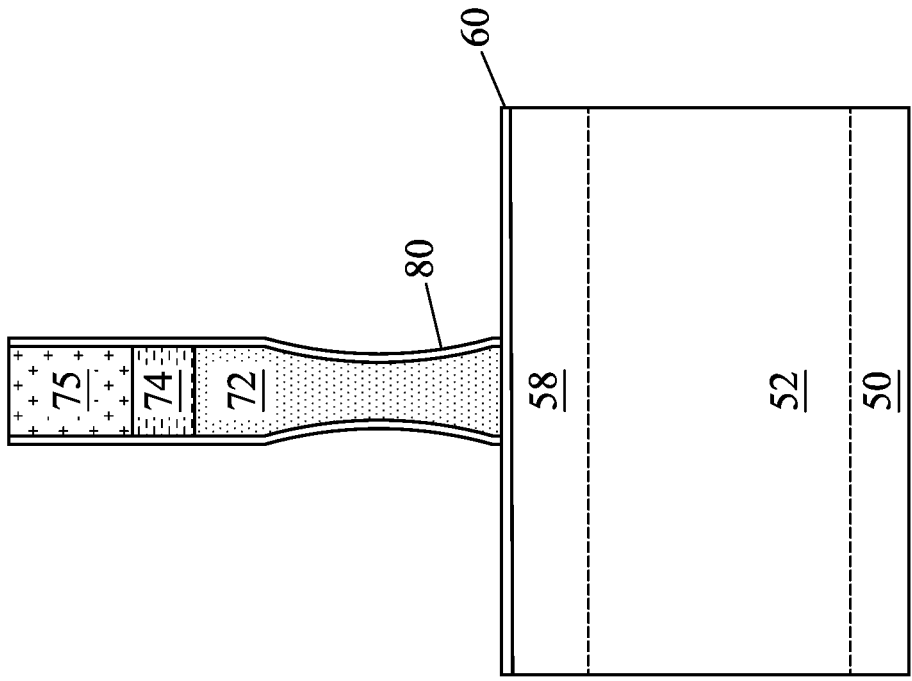
Figure 14A:
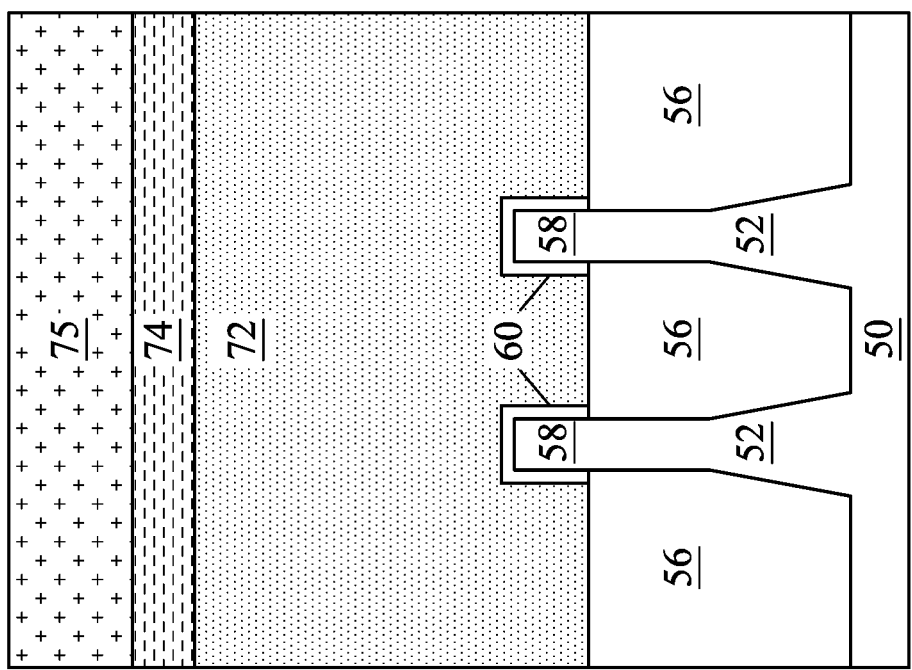

FIGS. 14A and 14B illustrate the structure in FIGS. 11A and 11B, but zoomed back out to a view such as illustrated in FIGS. 7A and 7B. Gate seal spacers 80 can be formed on exposed surfaces of the dummy gates 72, the masks 74, the padding 75, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 15B:
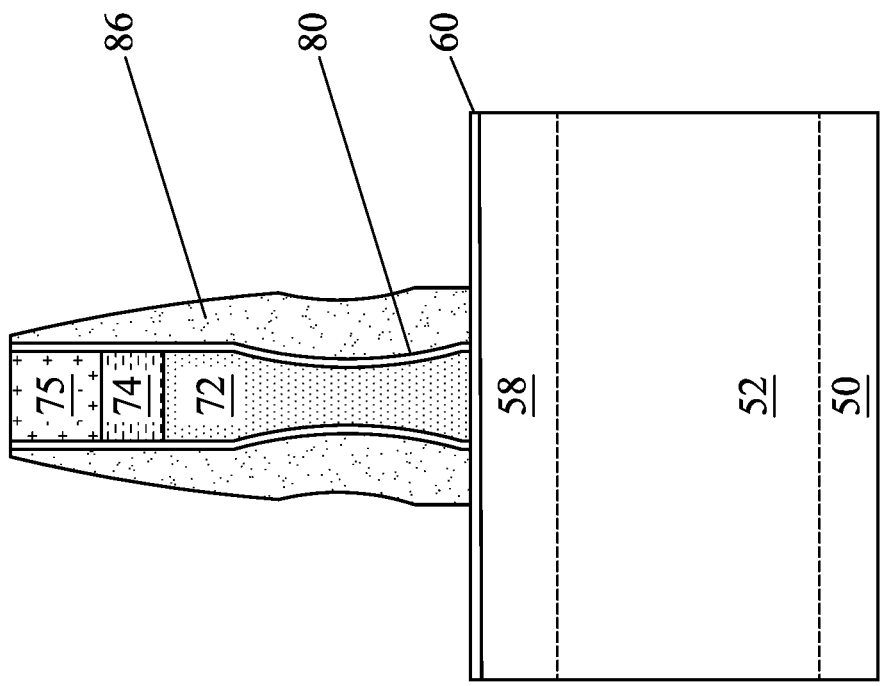
Figure 15A:
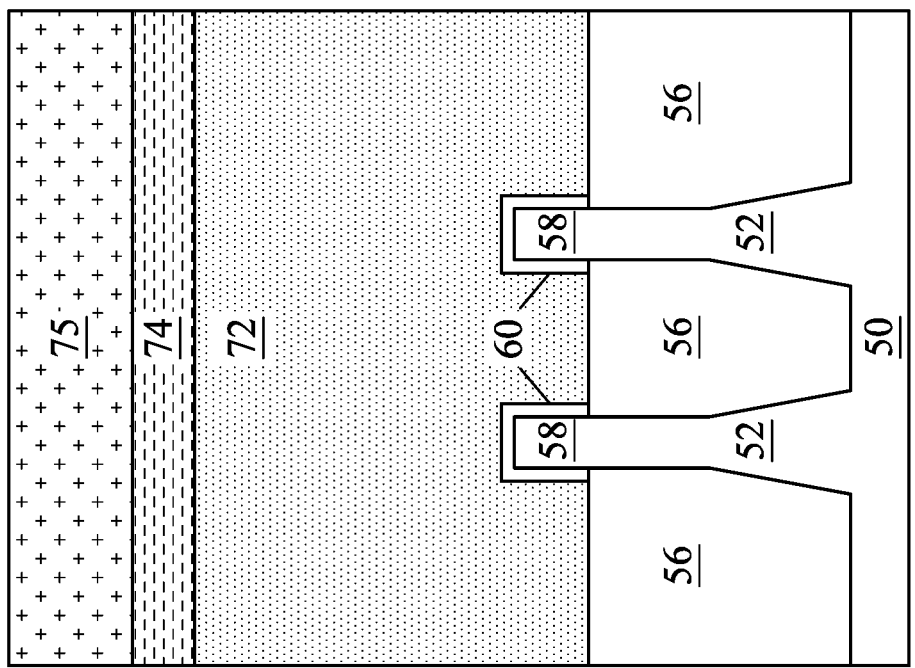

In FIGS. 15A and 15B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. As illustrated in FIGS. 15A and 15B, the gate spacers 86 may have an indented sidewall, which contours in to follow the necked profile of the dummy gate 72.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 16B:
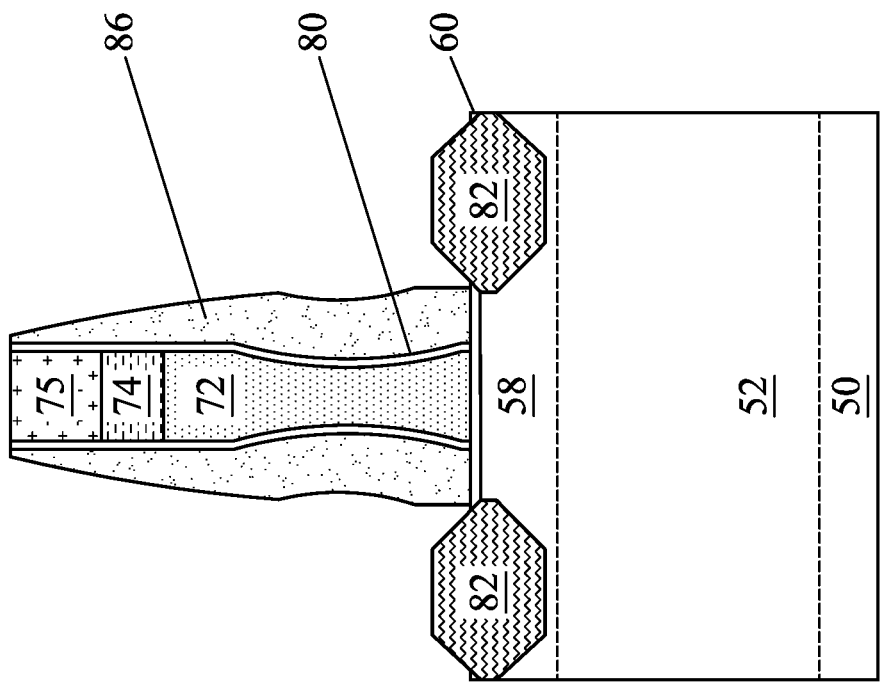
Figure 16A:
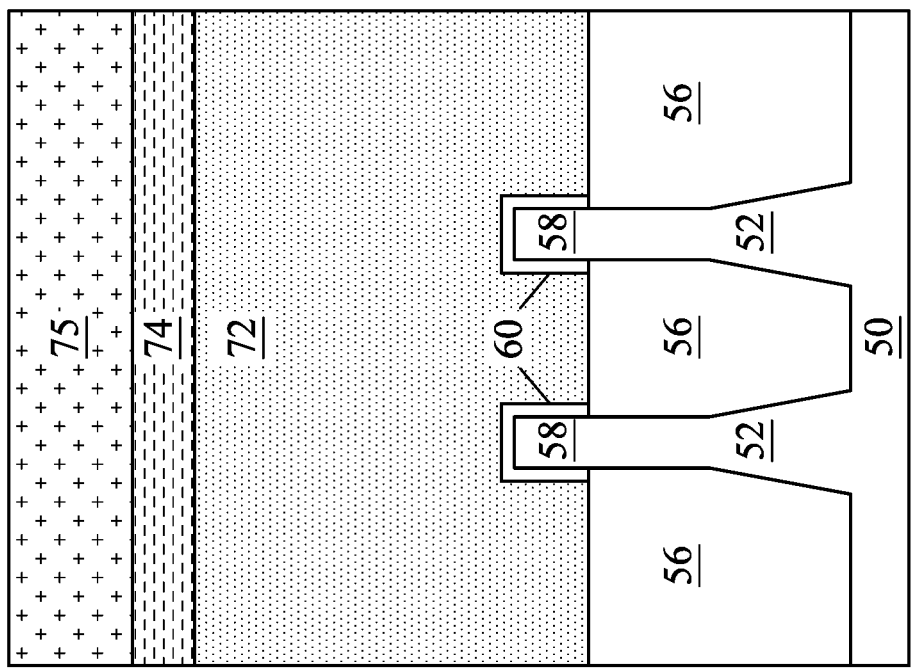
Figure 16C:
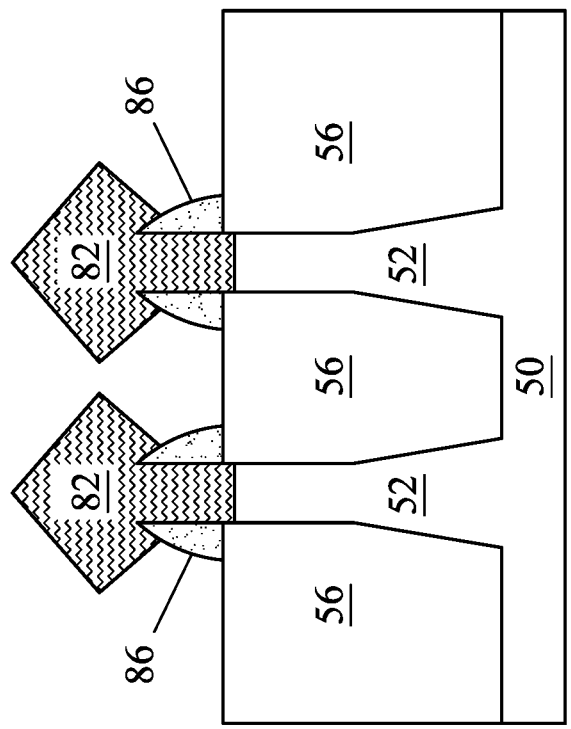
Figure 16D:
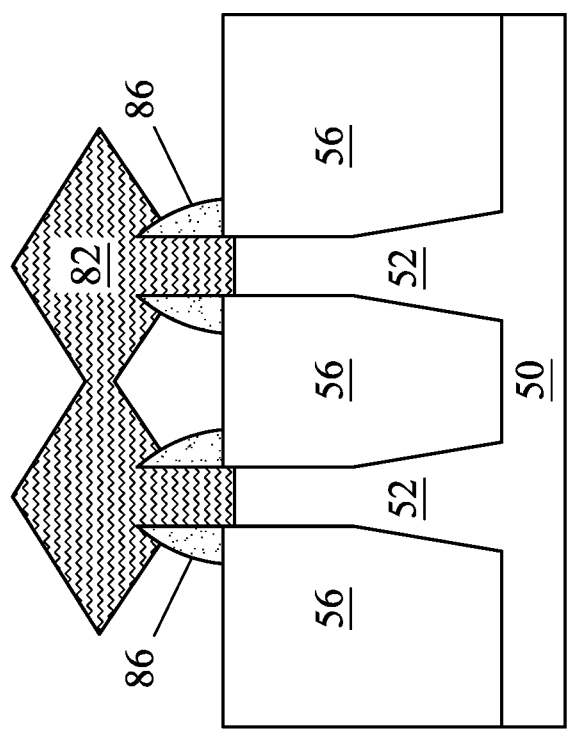

In FIGS. 16A and 16B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 16C. In other embodiments, adjacent source/drain regions 82 remain separated after the epitaxy process is completed as illustrated by FIG. 16D. In the embodiments illustrated in FIGS. 16C and 16D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 17B:
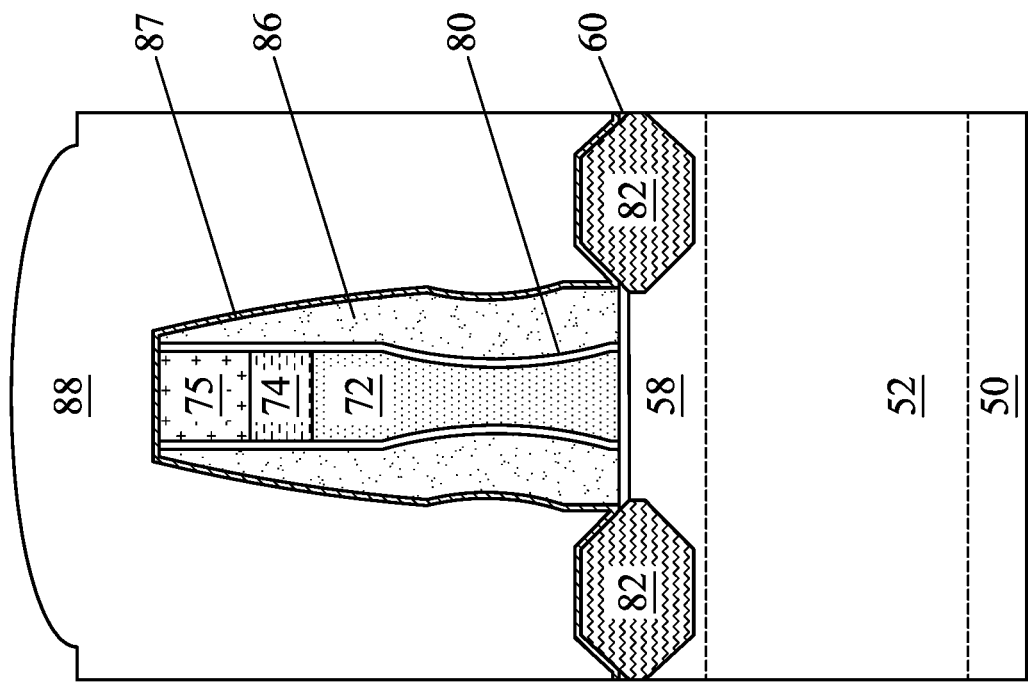
Figure 17A:
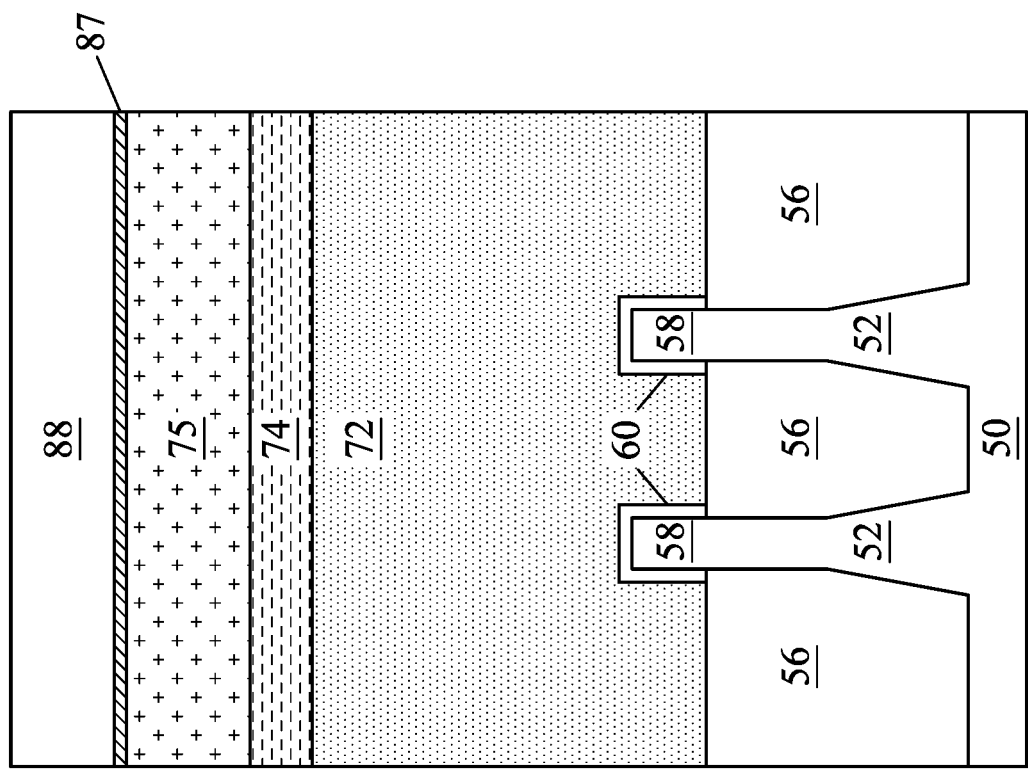

In FIGS. 17A and 17B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD.

Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 18B:
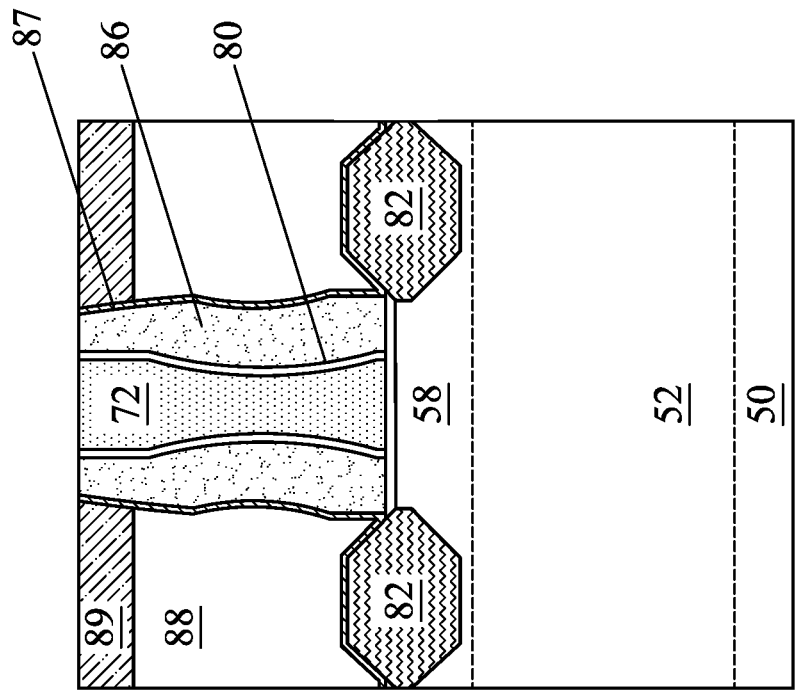
Figure 18A:
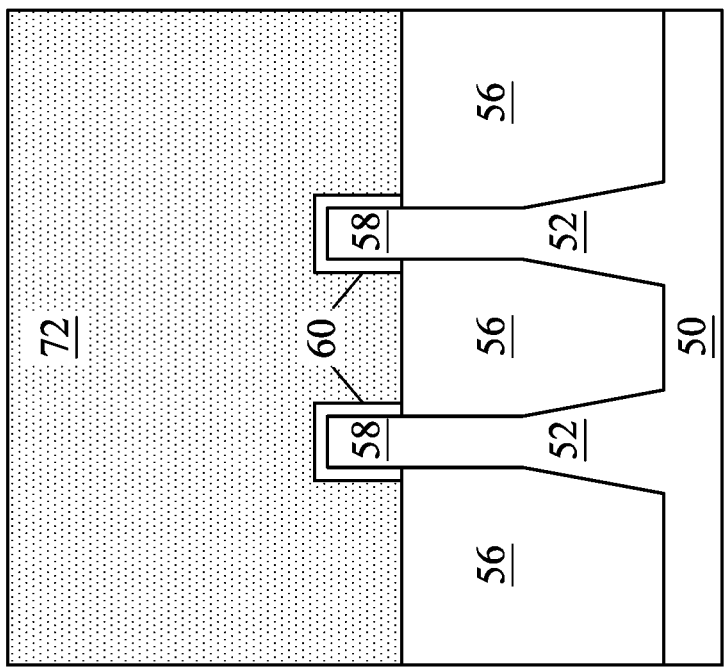

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

In some embodiments, following the planarization process, the upper surface of the ILD 88 may be recessed using an acceptable etching process, such as one that is selective to the material of the ILD 88 (e.g., etches the material of the ILD 88 at a faster rate than the material of the fins dummy gate 72 and gate spacers 867). For example, an oxide removal using, for example, dilute hydrofluoric (dHF) acid may be used. After recessing the ILD 88, a self-align masking layer 89 may be deposited in the recesses and then the upper surface of the self-align masking layer 89 may be planarized to again expose the upper surfaces of the dummy gate 72.

FIGS. 19A and 19B through FIGS. 28A and 28B illustrate a gate replacement process, where the dummy gate 72 is removed and replaced with a metal gate. The dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the self-align masking layer 89 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72. The resulting recesses 90 may be lined with the spacer layer 80 and have a shape corresponding to the dummy gates 72, for example, having an hour glass shape, side indented rectangular shape, or necked rectangular shape, as illustrated in FIGS. 19A and 19B.

FIGS. 20A, 20B, and 20C illustrate that, in some embodiments, the gate spacers 80 may be recessed by the dummy gate 72 removal process or may be optionally etched after removing the dummy gate 72 by an acceptable etching process. In FIG. 20A, the gate spacers 80 are recessed to be level with approximately the narrowest portion of the neck of the opening 90. In FIG. 20B, the gate spacers 80 are recessed partially, so that they fall within the upper portion of the opening 90, for example as illustrated where the opening 90 begins to narrow. In FIG. 20C, the gate spacers 80 are recessed to a point below the narrowest portion of the neck of the opening 90. In some embodiments, the gate spacers 80 are not etched at this process, but may be etched in a later process of etching back the metal layers of the replacement metal gate.

Figure 21B:
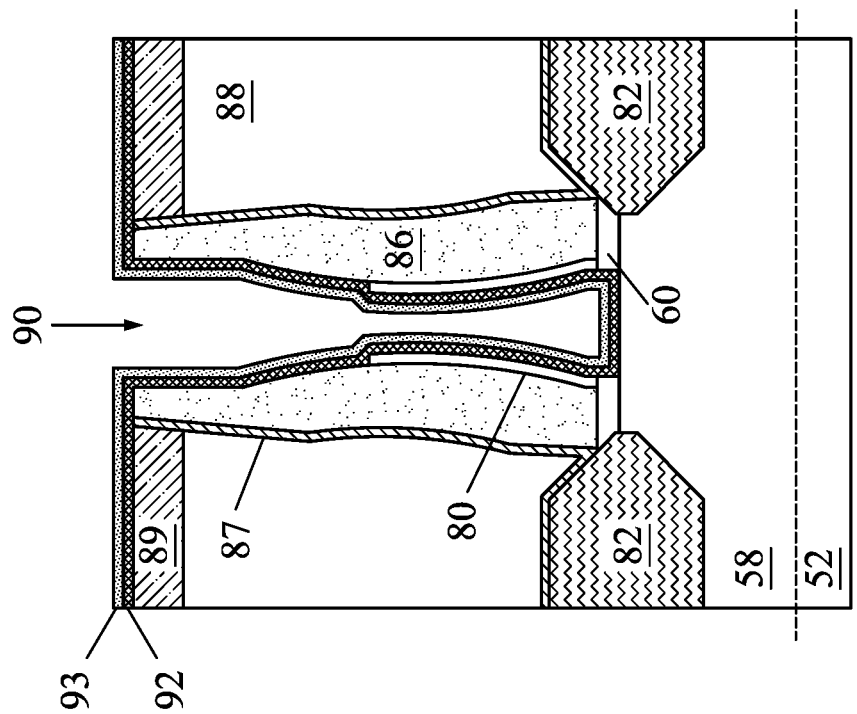
Figure 21A:
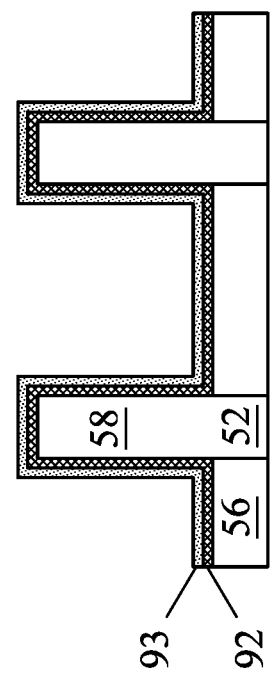

In FIGS. 21A, 21B, 22A, 22B, 23A, and 23B, gate dielectric layers 92, gate tuning layers 93, and gate electrodes 94 are formed for replacement gates. FIGS. 24A, 24B, 24C, and 24D illustrate detailed views of the dashed region outlined in FIG. 23B. In FIGS. 21A and 21B, gate dielectric layers 92 include one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the self-align masking layer 89. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

Gate tuning layers 93 are then deposited. The gate tuning layers 93 may include various work function layers and liner layers which may be deposited in such a manner to control the threshold operating voltage of the gate. Different areas of the device may have different threshold voltages and different configurations of layers can be used to tune the various threshold voltages. Examples of different configurations of the gate tuning layers are provided below with respect to FIGS. 24A, 24B, 24C, and 24D.

Figure 22B:
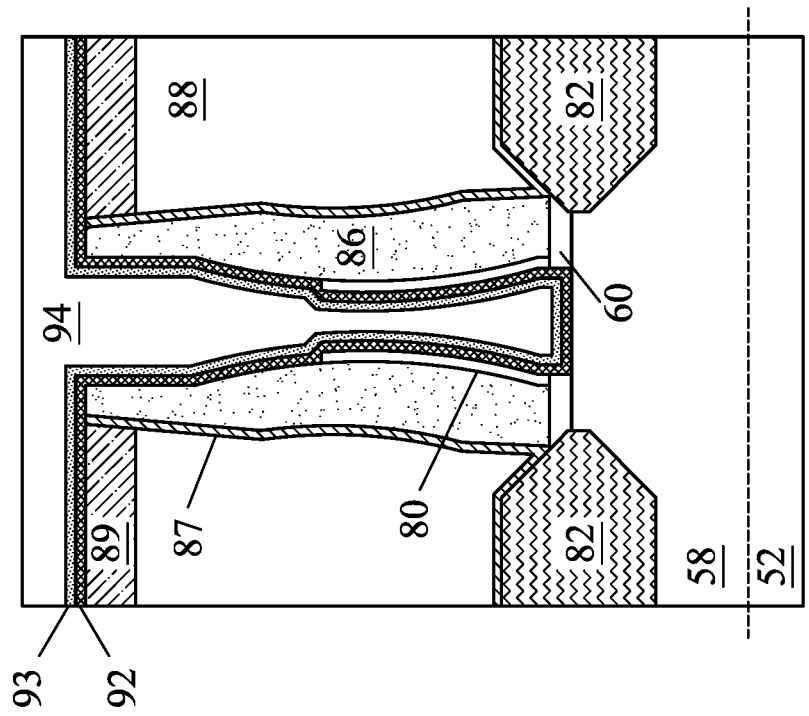
Figure 22A:
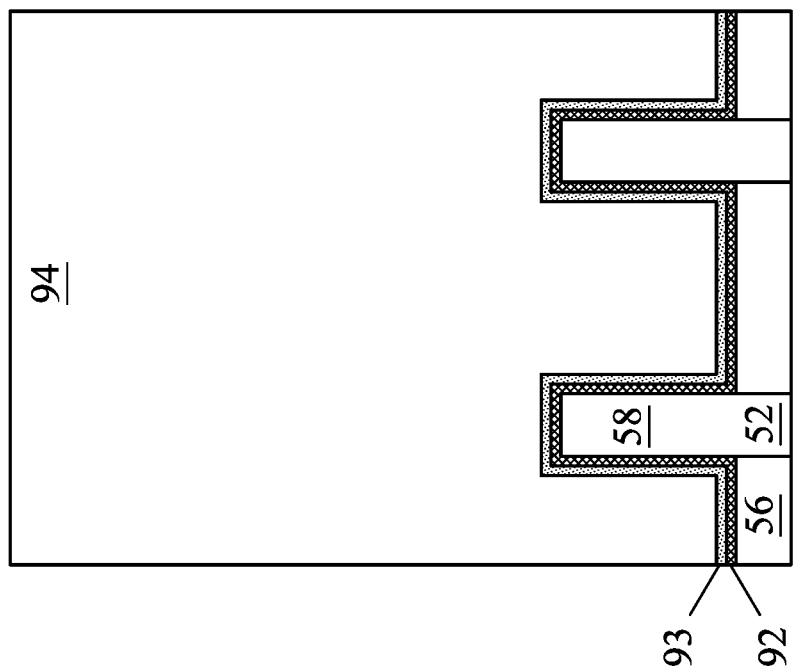

In FIGS. 22A and 22B, a gate electrode 94 may be formed by depositing a fill material into the recesses 90 to finish forming the gate electrodes 94. The gate electrodes 94 and gate tuning layers 93 may include metal-containing materials such as titanium nitride, titanium oxide, tantalum nitride, tantalum carbide, cobalt, ruthenium, aluminum, tungsten, combinations thereof, or multi-layers thereof.

Figure 23B:
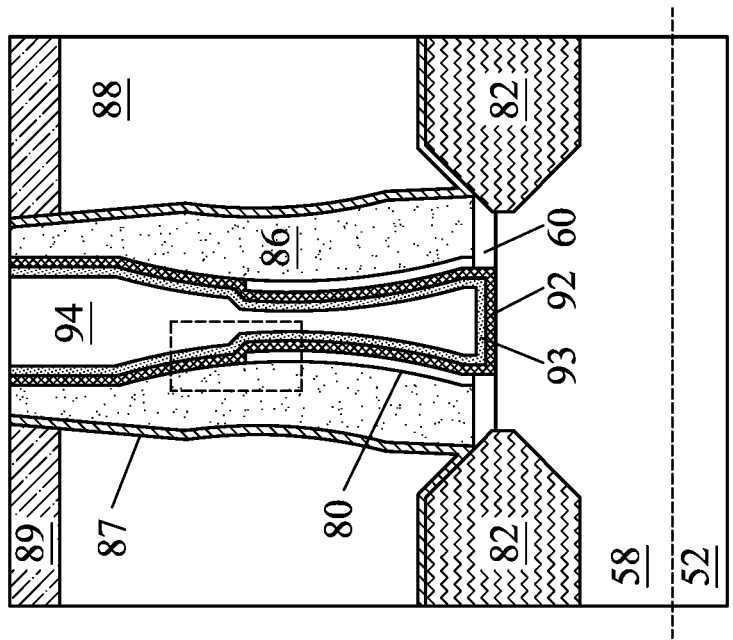
Figure 23A:
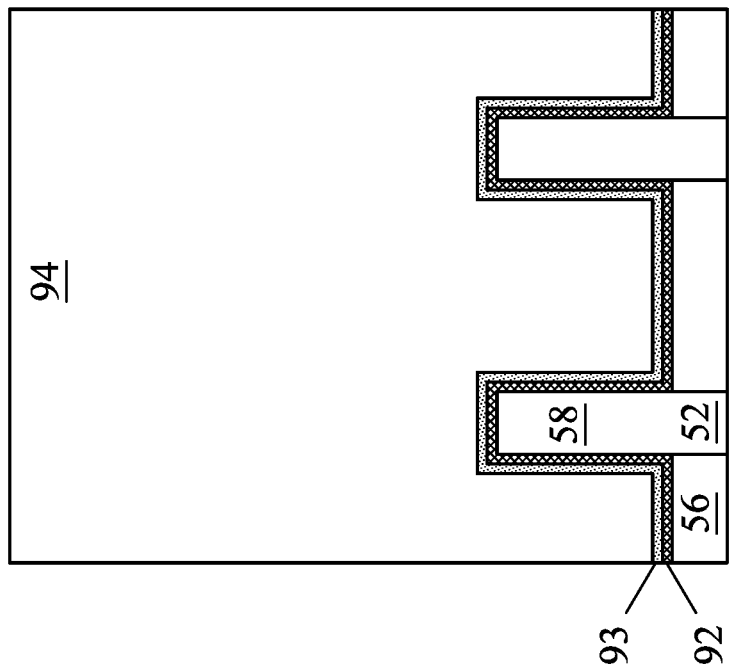

In FIGS. 23A and 23B, after the filling of the recesses 90, a planarization process, such as a CMP, may be performed to remove the excess portions of the gate dielectric layers 92, gate tuning layers 93, and the gate electrodes 94, which excess portions are over the top surface of the self-align masking layer 89. The remaining portions of material of the gate electrodes 94, gate tuning layers 93, and the gate dielectric layers 92 thus form replacement gates of the resulting FinFETs. The gate electrodes 94, gate tuning layers 93, and gate dielectric layers 92 may be collectively referred to as a "gate stack." The gate and the gate stacks may extend along sidewalls of a channel region 58 of the fins 52. Because the recesses 90 have necked profiles, the resulting gate stacks also have necked profiles, which aids in uniform etch back, as discussed further below.

The formation of the gate dielectric layers 92 in the n-type region 50N and the p-type region 50P may occur simultaneously such that the gate dielectric layers 92 in each region are formed from the same materials, and the formation of the gate tuning layers 93, and the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, the gate tuning layers 93, and/or the gate electrodes 94 in each region may be formed by distinct processes, such that the gate electrodes 94 may be different materials. Various masking steps may be used to mask and expose appropriate regions when using distinct processes.

In FIGS. 24A, 24B, 24C, and 24D, examples of various configurations of the gate tuning layers 93 are illustrated. It should be understood that the examples provided in FIGS. 24A, 24B, 24C, and 24D for each of the layers are merely examples and are not intended to be limiting. Other series of layers may be used in another order to achieve other configurations for the threshold voltages. Each of the configurations of the FIGS. 24A, 24B, 24C, and 24D may be utilized in different device regions of the FinFET to adjust the threshold voltage for each of the different device regions. The device regions 50A, 50B, 50C, and 50D may be subsets of the n-type device region 50N and/or p-type device regions 50P. In other words, the discussion of the various gate layers of the device regions 50A, 50B, 50C, and 50D may be applied to either or both of the n-type device region 50N and the p-type device region 50P, and the materials in each may be the same or different, depending on whether the device region 50A (or 50B, 50C, or 50D) is in the n-type device region 50N or the p-type device region 50P. Various masking steps may be used to mask and/or expose appropriate regions when forming layers in one region, but not another region. Like references are used to refer to like materials formed in like manner, however, the material selection may be varied depending on the device conductivity (n-type versus p-type) in the particular region.

Figures 24A, 24B, 24C, 24D:
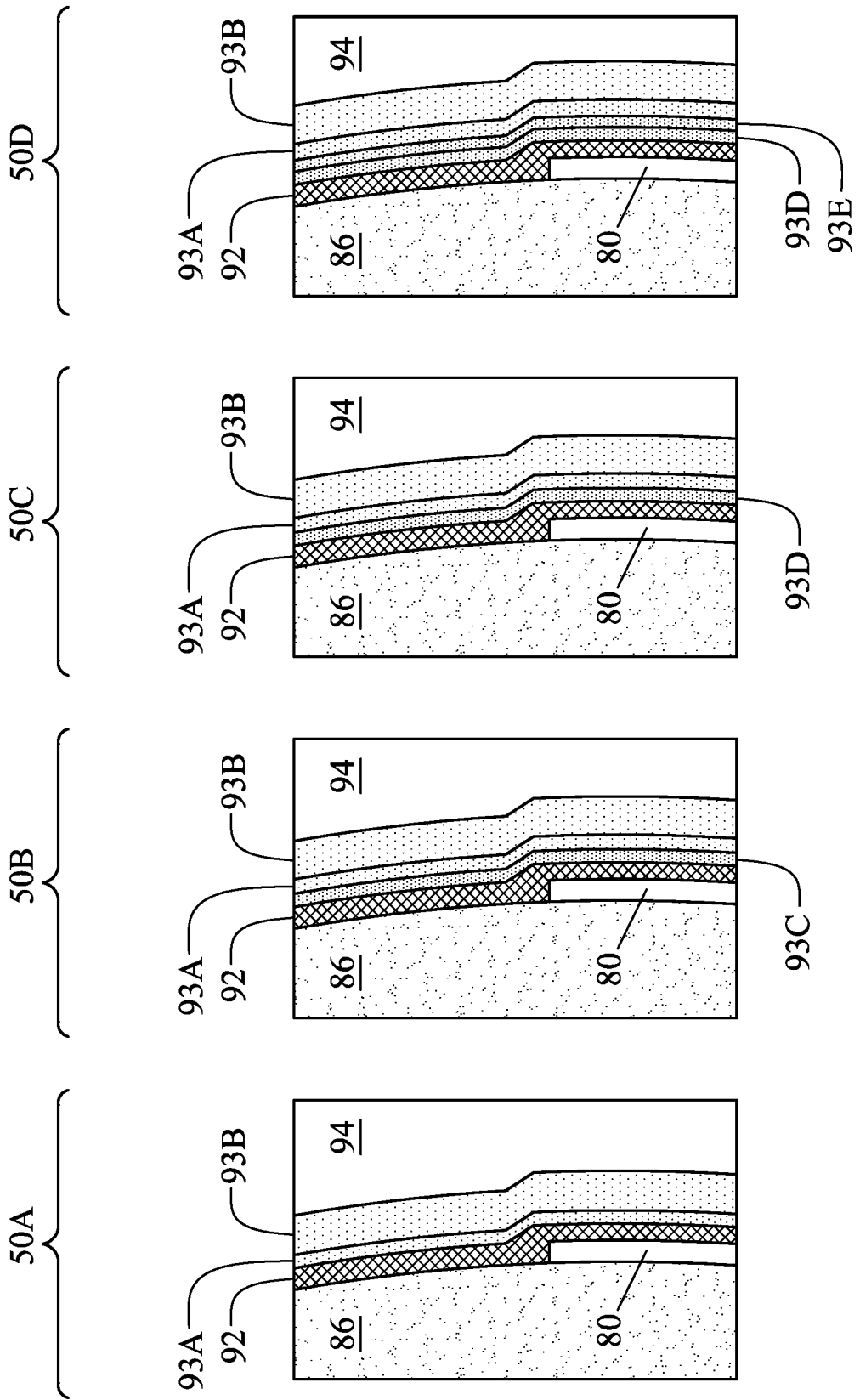
FIGS. 24A, 24B, 24C, and 24D illustrate enlarged cross-sectional views of an intermediate stage of forming a gate structure of FinFETs, in accordance with some embodiments.

In FIG. 24A, layer 92 may be a high-k dielectric layer. Work function layer 93A may be an n-type work function metallic layer. The material of work function layer 93A may be selected from TiC, TaC, TiAlC, Ti, Al, or the like, or combinations thereof. Work function layer 93A may be deposited using ALD, CVD, or the like, and is deposited as a conformal layer, which extends into recesses 90 and also has portions on top of the self-align masking layer 89. Glue layer 93B may be formed of a metal nitride such as TiN in accordance with some embodiments, and other materials such as TaN may be used. In accordance with some embodiments, glue layer 93B may be formed using ALD, and is deposited as a conformal layer, which extends into recesses 90 and also has portions over the self-align masking layer 89.

In FIG. 24B, an additional work function layer 93C may be interposed between the gate dielectric layer 92 and the work function layer 93A. By inserting the additional work function layer 93C, the threshold voltage is changed for that gate. Work function layer 93C may have a p-type work function. The material of work function layer 93C may be selected from a compound material such as TiN, TaN, $Ti_xAl_yN$, $Ti_xSi_yN$, $WC_xN_y$, $MoC_xN_y$, or the like, or combinations thereof. (Integers x and y indicate the atomic numbers.) The material of work function layer 93C may also be selected from an elemental material such as Au, Pt, Pd, W, or the like, or alloys thereof. The material of work function layer 93C may also include the compound material doped with the elemental material as aforementioned. The first work function layer 93C may be deposited using ALD, CVD, or the like, and may be deposited as a conformal layer, which extends into recesses 90 and may also has portions over the self-align masking layer 89.

In FIG. 24C, instead of including the work function layer 93C, another work function layer 93D is used. The work function layer 93D may have a second p-type work function. In accordance with some embodiments, the second work function is different from, and may be greater than or smaller than the first work function of work function layer 93C. The difference between the first and the second work functions may be greater than about 50 mV, and may be in the range between about 50 mV and about 150 mV, while greater or smaller differences may be adopted also. The material of work function layer 93D may be selected from the same (or different) group of candidate materials for forming work function layer 93C, while the materials of work function layers 93C and 93D are different from each other. The work function layer 93D may be deposited using ALD, CVD, or the like, and is deposited as a conformal layer, which extends into recesses 90 and also has portions over the self-align masking layer 89.

In FIG. 24D, an additional work function layer 93E is deposited and used in addition to the work function layer 93D. The work function layer 93E may have a third p-type work function different from the first work function of work functions layer 93C and the second work function of work function layer 93D. In accordance with some embodiments, the third work function is different from, and may be greater than or smaller than, either of the first work function and the second work function. The difference between the third work function and either of the first and the second work functions may be greater than about 50 mV, and may be in the range between about 50 mV and about 150 mV, while greater or smaller differences may be adopted. The material of work function layer 93E may be selected from the same or different group of candidate materials of work function layers 93C and 93D. The materials of work function layers 93C, 93D, and 93E may each be different from each other. For example, work function layers 93C, 93D, and 93E may be formed of TiN, WCN, and TiSiN, respectively, which have work functions with a relatively large difference from each other. Work function layer 93E may be deposited using ALD, CVD, or the like, and is deposited as a conformal layer, which extends into recesses 90 and also has portions over the self-align masking layer 89.

As noted above with respect to FIG. 23B, after depositing the various layers of the gate tuning layers 93 and gate electrode 94, the upper surfaces of the gate dielectric layers 92, gate tuning layers 93, and gate electrode 94 may be planarized to level the upper surfaces with one another.

Figure 25B:
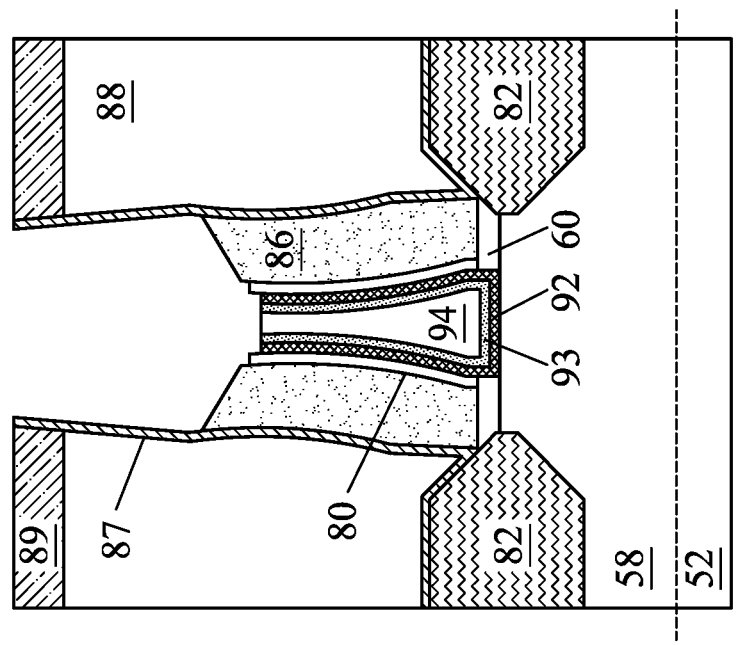
Figure 25A:
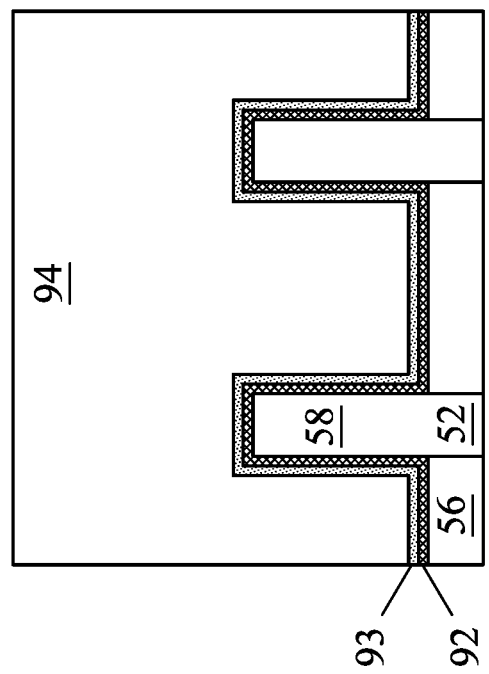

In FIGS. 25A and 25B, an etch back process is performed to recess the gate dielectric layers 92, the gate tuning layers 93, and the gate electrode 94. Recessing these structures provides spacing so that a subsequently formed self-aligned contact can be formed to the source/drain region 82, without risking a potential short between the source/drain contacts (i.e., contacts to the source regions and/or the drain regions) and the gate contacts. Because the various device regions (e.g., device regions 50A, 50B, 50C, and 50D) may have different gate tuning layers 93, it is ordinarily difficult to control how much of the gate stack remains after the etch back process. Thus, the etch back process may ordinarily result in different gate heights between device regions. This is not desirable because, in such situations, too much etching for the etch back may damage the fin/channel region underlying the gate stack and too little etching may result in undesirable leakage or shorting between the subsequently formed gate contacts and source/drain contacts.

Embodiments of the present disclosure, however, resolve this issue by using the necking profile of the gate stacks. As the gate stack is recessed by a self-aligned etch, the necking profile causes the etching of the gate stack to slow in that area. For example, the etch rate of a first gate stack in the device region 50A may be w, the etch rate of a second gate stack in the device region 50B may be x, the etch rate of a third gate stack in the device region 50C may be y, and the etch rate of a fourth gate stack in the device region 50D may be z, where w>x>y>z. As a result, the gate stack is reduced faster in the device region 50A than the gate stack in the device region 50D. However, as the etching reaches the necked portion of the gate stack, each of the etch rates slow, allowing the etching in the other regions time to catch up, resulting in more uniform and better controlled gate stack remaining heights. At some point in time in the etching process, as the gate stack begins to narrow through the neck, the etch rate w slows so that w<x. The etch rate w may continue to slow until w<y, and continue to slow still until w<z, due to the dimensions of the necking portion of the gate stack. When the etch rate w falls below the etch rate x, then the etching in the device region 50B is faster relative to the etching in the device region 50A, allowing the recessed gate stacks in the device region 50B to more closely even out with the recessed gate stacks in the device region 50A. When the etch rate w falls below the etch rate y, then the etching in the device region 50C is faster relative to the etching in the device region 50A, allowing the recessed gate stacks in the device region 50C to more closely even out with the recessed gate stacks in the device region 50A. When the etch rate w falls below the etch rate z, then the etching in the device region 50D is faster relative to the etching in the device region 50A, allowing the recessed gate stacks in the device region 50D to more closely even out with the recessed gate stacks in the device region 50A. A similar effect is realized with the etch rate x relative to the etch rates y and z, and the etch rate y relative to the etch rate z.

Figure 26:
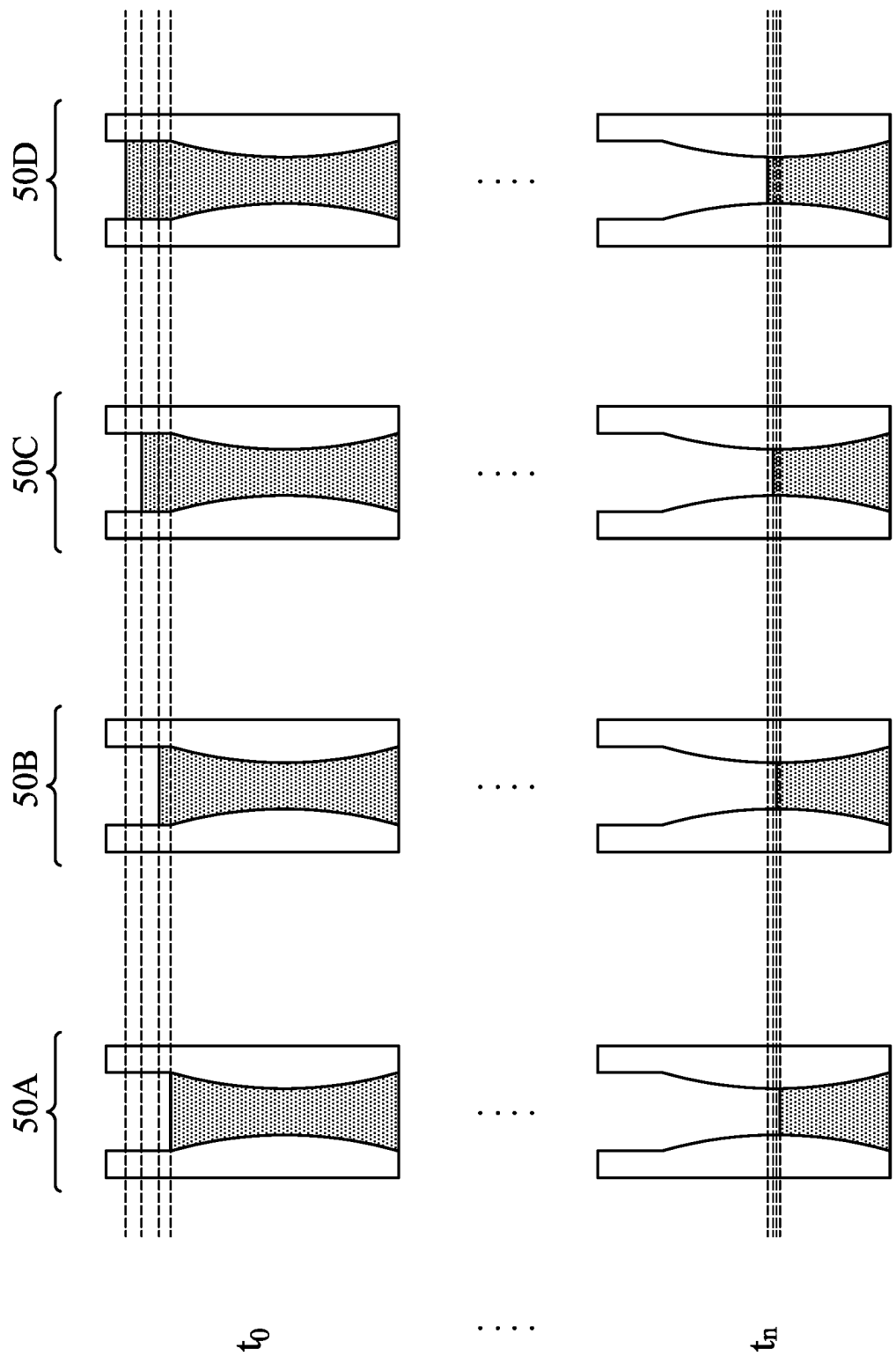
FIGS. 26 and 27 illustrate views of an etch back process of a gate structure with a transitioning etch rate, in accordance with some embodiments.
Figure 27:
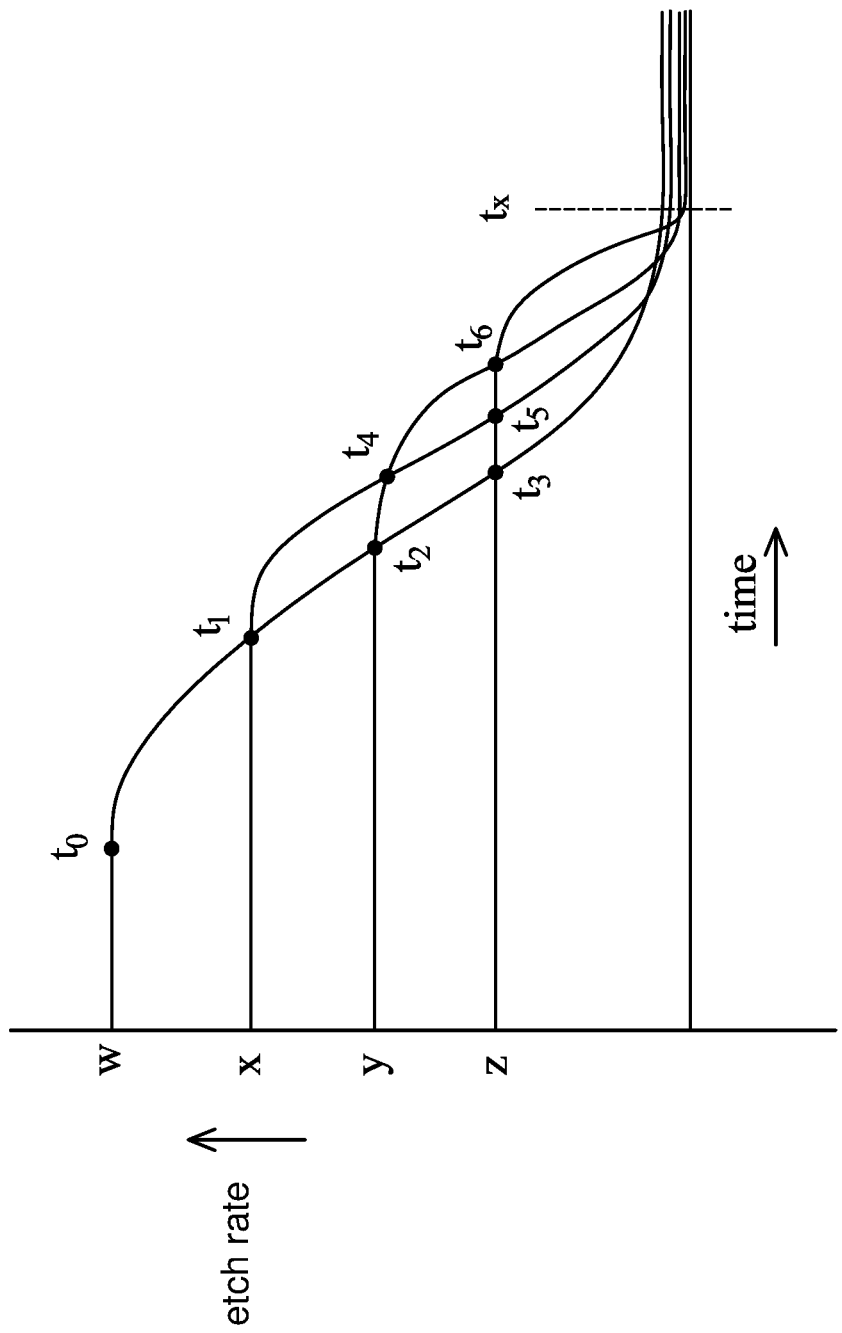

This principle is illustrated in FIGS. 26 and 27. At time to, a structure is etched more in the device region 50A than in the device regions 50B, 50C, and 50D, more in the device region 50B than in the device regions 50C and 50D, and more in the device region 50C than in the device region 50D. The distance between the dashed lines and the tops of the surrounding structure reflects the relationship between the etch rates. At time $t_n$, the realized differences in the etch rates have narrowed considerably, i.e., the distance between each dashed line and the tops of the surrounding structures are closer to each other through the necked portion of the surrounding structure.

In FIG. 27, at time to, the etch rate w, begins to slow and at time t1, the etch rate w becomes less than the etch rate x. At time t2, the etch rate w becomes less than the etch rate y, and at time t3, the etch rate w becomes less than the etch rate z. At time t4, the etch rate x becomes less than the etch rate y, and at time t5 the etch rate x becomes less than the etch rate z. At time t6, the etch rate y becomes less than the etch rate z. At time $t_x$, all of the etching is within the neck portion of the device regions 50A, 50B, 50C, and 50D, and the etch rates revert back to their original relationship in that the w>x>y>z. However, the differences in the etch rates are less than the differences initially. When the relationships of the etch rates reverse, then the etching depths in each of the device regions 50A, 50B, 50C, and 50D become closer to each other. The realized or effective etch rate when accounting for the etch rate slow down becomes normalized with respect to each of the etch rates. For example, the etch rates w, x, y, and z initially may be within about 25% of each other. The overall effective etch rates w, x, y, and z at the completion of the etching process may be within about 5% of each other.

Referring again to FIGS. 25A and 25B, the etch back may be performed until the upper surface of the gate fill 94 is at or below the narrowest width of the neck between the gate spacers 80. The height of the gate fill 94 over the fin 52 and channel region 58 may be in a range of about 6 nm to about 16 nm. If the height is too great then a short may occur between a subsequently formed source/drain contact and the metal gate, however, if the height is too small then the underlying fin 52 and/or channel region 58 may become damaged.

Figure 28B:
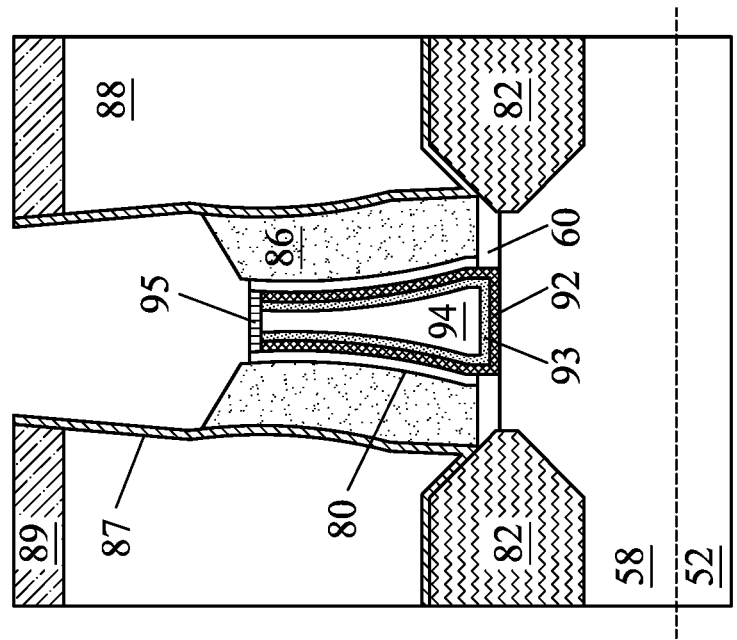
Figure 28A:
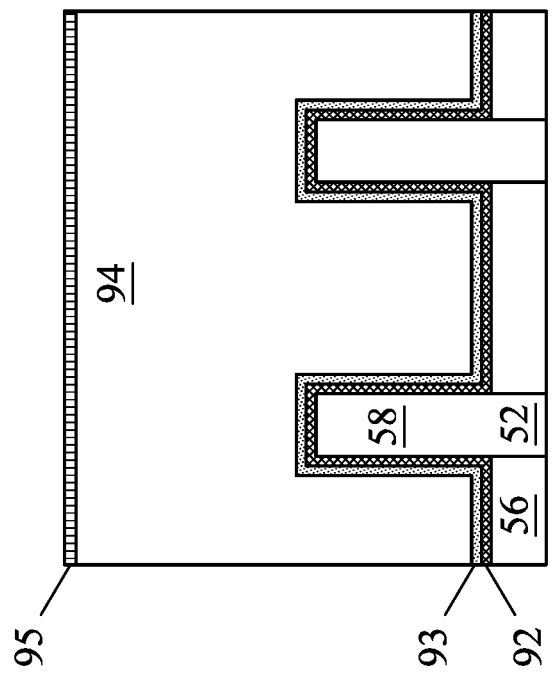

In FIGS. 28A and 28B, an optional metal capping layer 95 may be formed over the recessed gate stack. The optional metal capping layer 95 may be formed by an acceptable deposition process, such as by PECVD, ALD, PVD, electro plating, electroless plating, and so forth. For example, in some embodiments, a pre-cursor with high selectivity to metal may be used, reacting with a suitable reactant gas and forming the optional metal capping layer 95. The optional metal capping layer 95 may be made of any suitable material, such as tungsten, tungsten nitride, tungsten fluoride, the like, or combinations thereof.

Figure 29B:
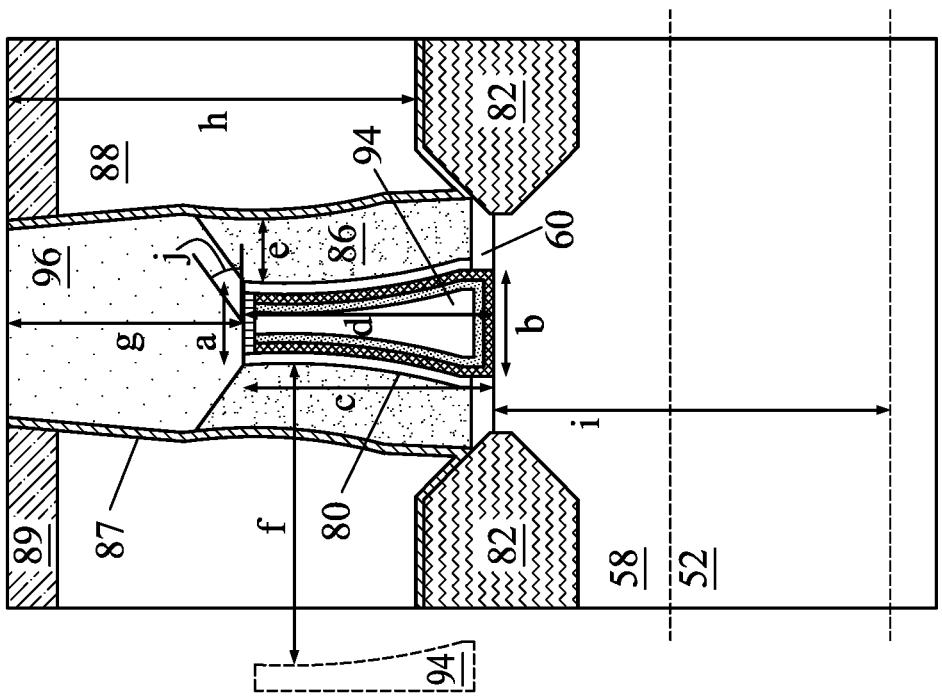
Figure 29A:
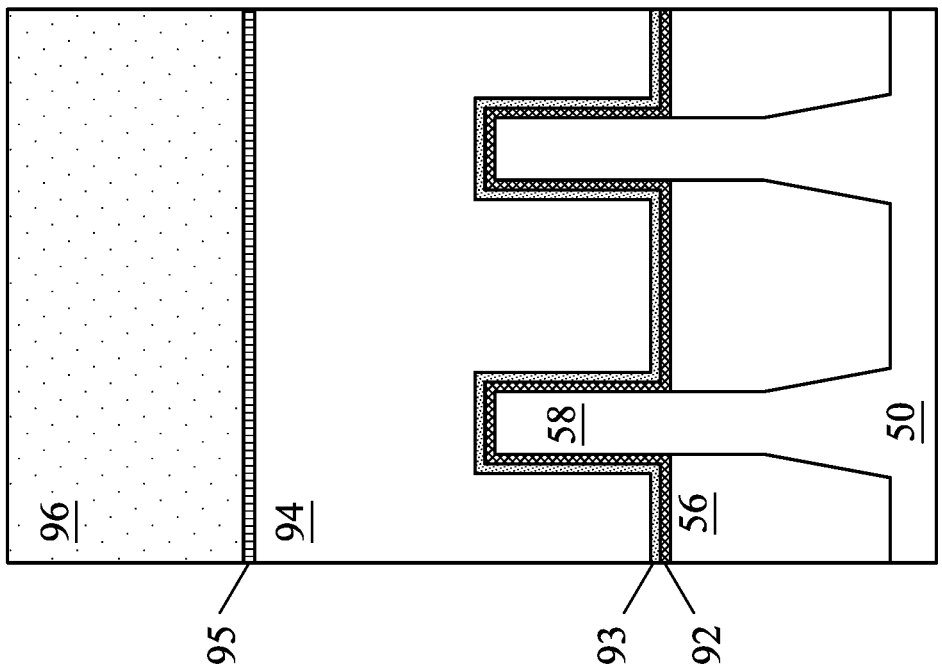

In FIGS. 29A and 29B, a gate mask 96 is formed over the gate stack (including a gate dielectric layer 92, gate tuning layers 93, and a corresponding gate electrode 94), and the gate mask 96 may be disposed between opposing portions of the gate spacers 86 and between opposing sidewalls of the ILD 88. The gate mask 96 may include one or more layers of dielectric material, such as silicon nitride, silicon oxynitride, or the like, is filled in the recess, followed by a planarization process to remove excess portions of the dielectric material extending over the self-align masking layer 89. The gate mask 96 is used in forming a self-aligned contact to the source/drain region, to prevent over-etching into the gate structures. Because the recessing of the gate stacks may be performed with a realized etch rate in each of the regions 50A, 50B, 50C, and 50D within 5%, the thickness of the gate mask 96 in each of the regions 50A, 50B, 50C, and 50D may be within about 5% of each other as well.

FIG. 29B illustrates several dimensions of the gate stack, gate spacers 86, gate mask 96, and fin 52 height. The distance a is the width at the top portion of the gate stack. When the gate stack is recessed, it is recessed until the narrowest width of the gate stack or below that point, so the distance a corresponds about to the width w3 (see FIG. 10). The distance b is the width of the gate stack at the interface of the gate stack with the upper surface of the fin 52 in the channel region 58. The distance c is the gate height over the upper surface of the fin 52 at the edge of the gate electrode 94. The distance d is the gate height over the upper surface of the fin 52 at the middle of the gate electrode 94. The distance e is the width of the gate spacers 86 adjacent the gate stack. The distance f is the gate to gate distance between neighboring gates. A neighboring gate is partially displayed in a dashed outline. The distance g is the thickness or height of the gate mask 96 over the gate stack. The distance h is the thickness or height of the ILD 88 and self-align masking layer 89 over the source/drain regions 82. The distance i corresponds to the height of the fin 52 that protrudes from the substrate 50. The angle j is the angle of the top surface of the gate stack as compared to a horizontal reference line.

The distances and dimensions described above may be set relative to one another to ensure proper device performance. As explained above, the neck portion of the gate stack causes the etch rates to reduce so that a more even etching result is attained. In order for the etch rate to reduce effectively, the distance a may be between about 10 and 15 nm. During the depositions of the various gate layers (gate dielectric layers 92, gate tuning layers 93, and gate electrode 94), in order to avoid forming a void, the distance b corresponding to the width of the gate stack at the interface with the fin 52 may be between about 13 and 20 nm. In addition, the distance b should be greater than or equal to a, and the ratio of a:b may be about 0.5 to 0.8. In order to avoid a short between the metal gate and the subsequently formed source/drain contact, the distance c corresponding to the gate height at the edge of the metal gate is less than or equal to about 40 nm, which can be set when the planarization of the gate dielectric layers 92, gate tuning layers 93, and the gate electrode 94 (see FIGS. 23A and 24B). Similarly, the distance d corresponding to the gate height at the middle of the metal gate is also less than or equal to about 40 nm. In addition, the ratio of c:d is between about 0.5 and 2. As noted above, when recessing the gate stack, to avoid fin damage, the distance d may greater than 0 and should be greater than or equal to about 6 nm to ensure proper gate function and acceptable electrical performance. Without proper gate function the resulting end product will have less efficiency, consuming excess power, and generating excess heat through inefficient/poor performance.

To avoid loss of the ILD 88 or the self-align masking layer 89, the distance e corresponding to the gate spacer 86 width may be between about 5 and 13 nm. The distance f from gate to gate may be between 20 and 30 nm. The distance g which is the height of the gate mask 96 corresponds to the depth of recessing the gate stack which may be between about 40 and 75 nm. The ratio of the distance h to the distance d, where h corresponds to the height of the ILD 88 and self-align masking layer 89 over the source/drain regions 84 and where d corresponds to the gate height over the fin, may be between about 2 and 8. This ratio provides a better etching window for forming the source/drain contacts (discussed below). For proper gate function and increased electrical performance, the distance i of the fin height correlates to the distance d of the gate height over the fin. The ratio of d:i may be between about 0.1 and 0.7. The angle j of the top surface of the gate stack may be less than or equal to 45 degrees, including negative angles less than 0 degrees, such as up to −45 degrees to help avoid a short between the metal gate and the subsequently formed source/drain contact.

Figure 30:
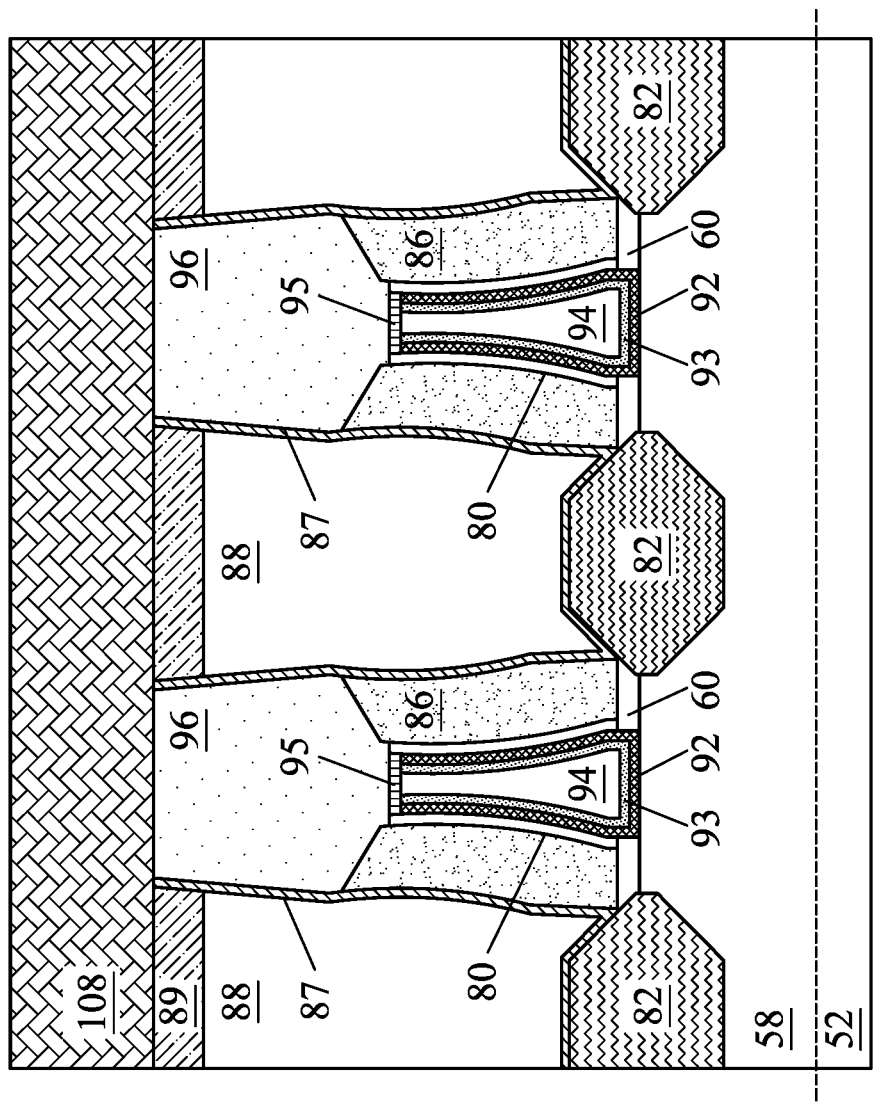

In FIG. 30, a second ILD 108 is deposited over the first ILD 88 and over the self-align masking layer 89. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 penetrate through the second ILD 108 and the gate mask 96 to contact the top surface of the recessed gate electrode 94 or optional metal capping layer 95.

Figure 31:
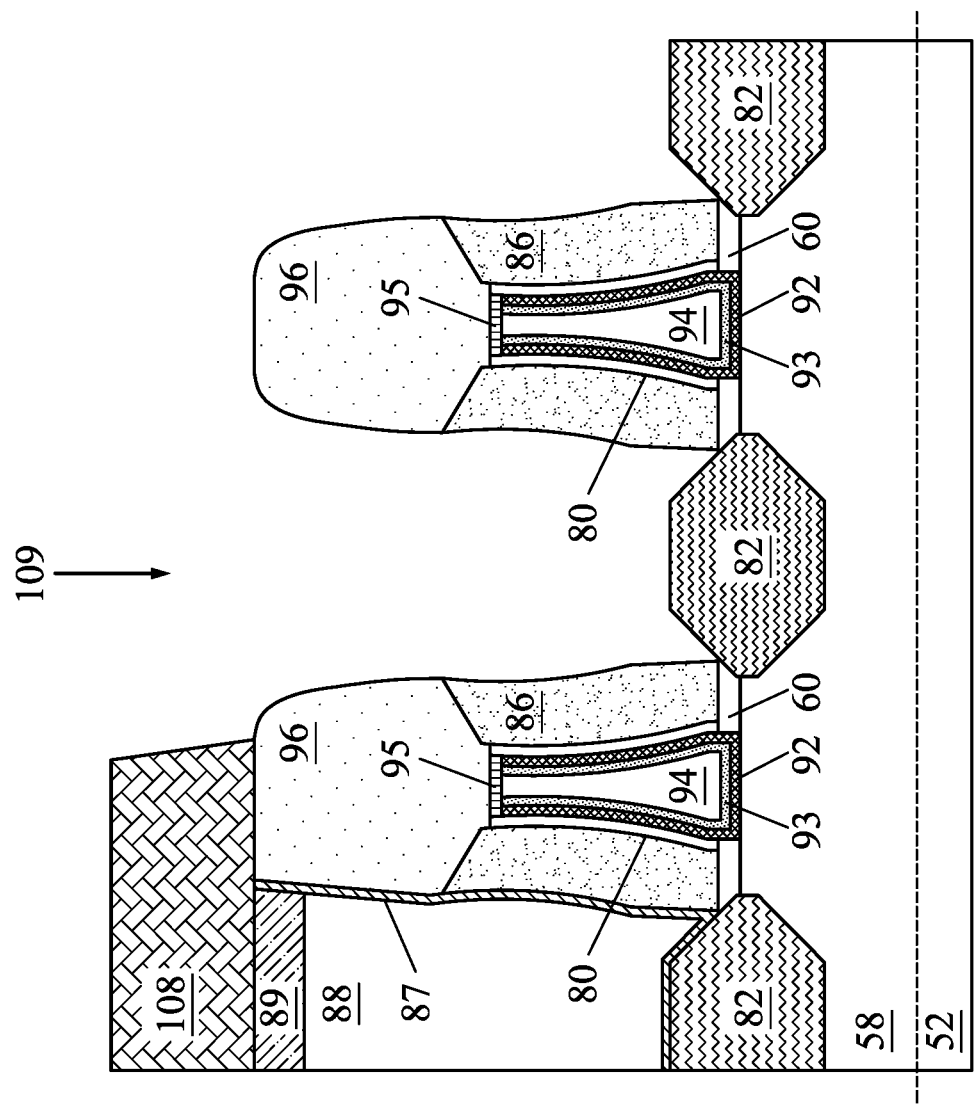

In FIG. 31, a source/drain contact opening 109 is formed through the second ILD 108, through the self-align masking layer 89 and through the ILD 88 to expose the source/drain regions 82. The source/drain contact opening 109 may be performed using a self-align etching technique so that the gate mask 96 may become part of the etching mask for forming the opening 109. As a result of the self-aligned etching process, etching the opening 109 may partially etch the gate mask 96, the CESL 87 and the gate spacers 86. Openings for forming a gate contact may also be formed through the second ILD 108 and through the gate mask 96, however, such gate contact openings may be formed in a parallel cross-section. The openings 109 and gate contact openings may be formed using acceptable photolithography and etching techniques, however, due to the self-aligned etching process, the openings 109 may span over multiple gates to form multiple source/drain contacts at the same time.

Figure 32A:
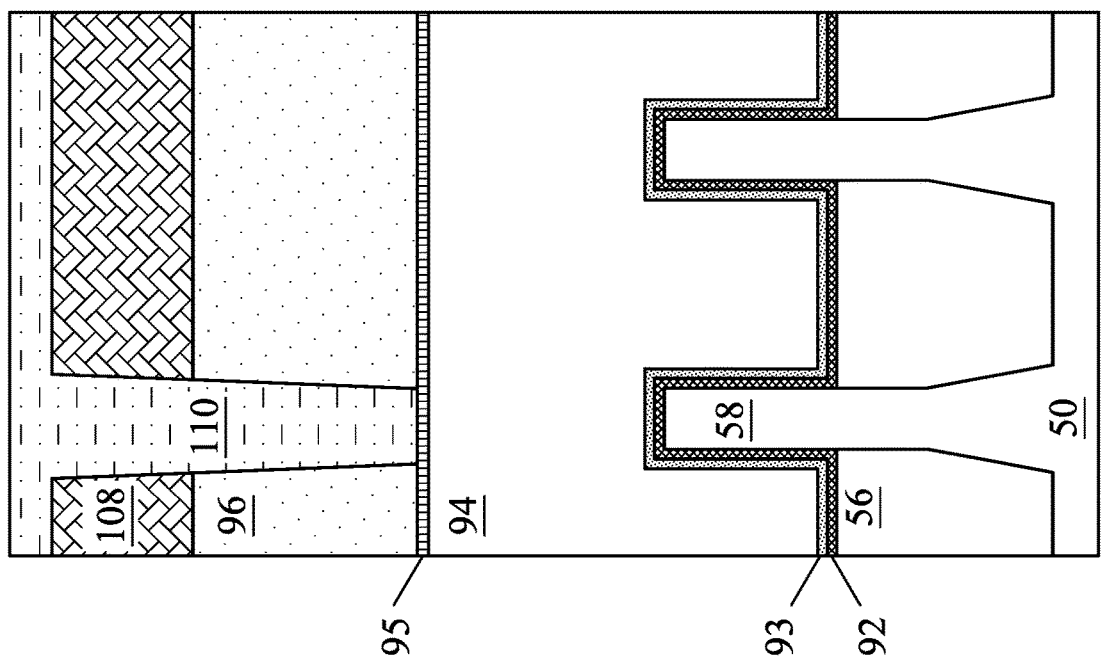
Figure 32B:
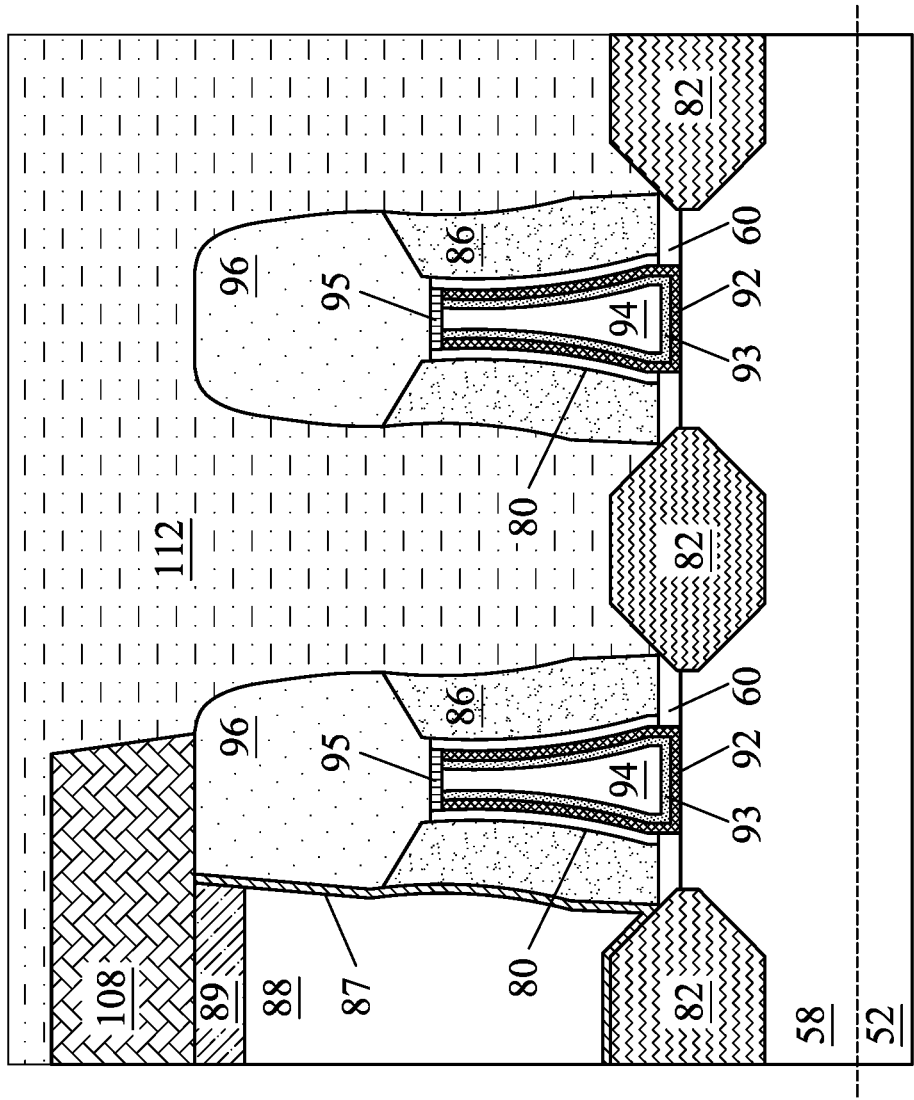

In FIGS. 32A and 32B, gate contacts 110 and source/drain contacts 112 are formed. A liner (not shown), such as a diffusion barrier layer, an adhesion layer, or the like, and a conductive material are formed in the openings 109 and in the gate openings. The liner may include titanium, titanium nitride, tantalum, tantalum nitride, or the like. The conductive material may be copper, a copper alloy, silver, gold, tungsten, cobalt, aluminum, nickel, or the like.

Figure 33A:
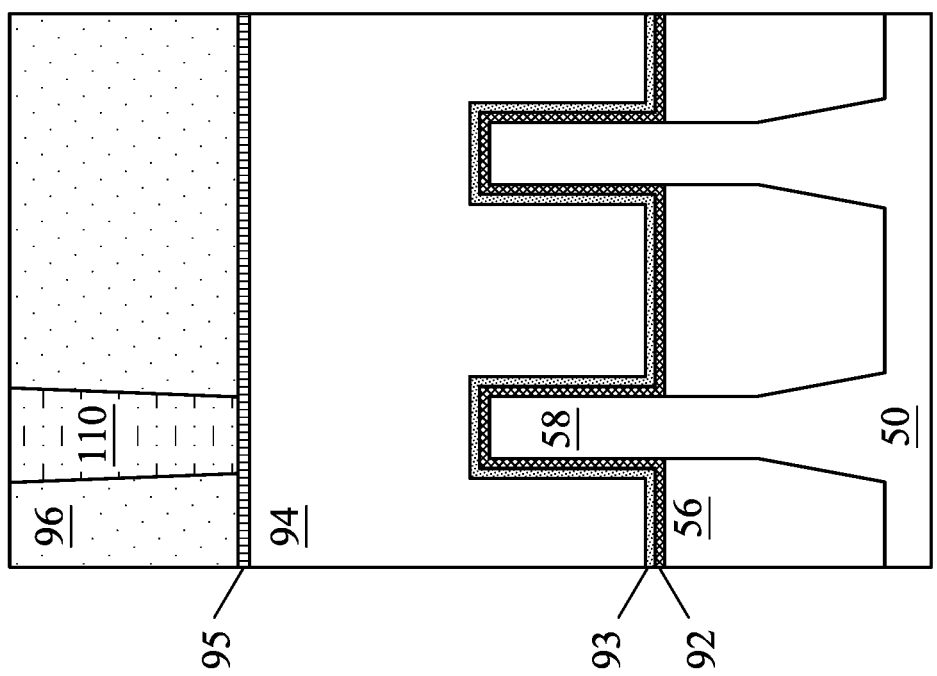
Figure 33B:
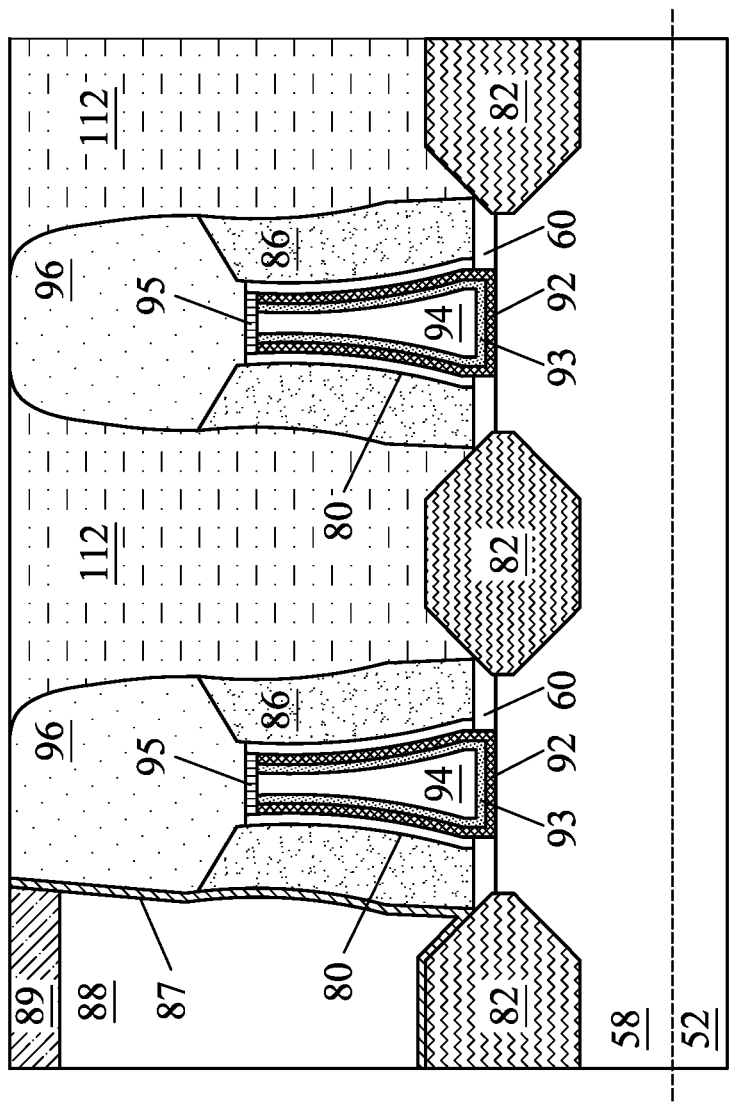

In FIGS. 33A and 33B, a planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process.

In some embodiments, such as illustrated in FIGS. 33A and 33B, the planarization process may continue to remove the ILD 108 and optionally a portion of the gate masks 96 in order to separate the source/drain contacts 112 from one another. Alternatively, the source/drain contacts 112 may be left bridged over some of the gate stacks. Additional processes may be performed, such as forming interconnects over the structure and coupling the gates or source/drains to other features or devices.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Embodiments advantageously provide a way of etching dummy gate electrodes to have a particular cross-sectional profile which may have indented sidewalls, forming a neck or hour glass shape, straight sidewalls, or expanded sidewalls to form a jar shape. The dummy gate electrodes are subsequently replaced and the profiles are transferred to the replacement metal gates. Some embodiments advantageously provide a way of using self-aligned contact schemes with device regions having multiple voltage thresholds. After the metal gate stacks are formed, the metal gate stacks have a narrow neck or hour glass shape over the channel region. When performing an etch back of the gate stack to provide room for a gate mask suitable for use in a self-aligned contact scheme, all the replacement gate stacks may be etched at the same time. Because the gate stacks may have different configurations to achieve multiple threshold voltage tuning, the etch rates of the gate stacks are different in the different device regions. When the gate stack etching extends into the narrow neck portion, the etch rate slows, providing time for etching distances from the slower etch rates to catch up to the etching distances from the faster etch rates. Accordingly, the overall effective etch rate is normalized for each of the replacement gate stacks and the resulting gate height is more uniform.

One embodiment is a device including a semiconductor fin extending above a substrate. The device also includes a gate structure disposed over the semiconductor fin, the gate structure extending perpendicular to the semiconductor fin, the gate structure including: a gate dielectric layer, one or more work function layers, a gate electrode, and a gate mask disposed over the gate electrode, where a width of the gate structure at a top of the gate electrode is narrower than a width of the gate structure where the gate structure interfaces with an upper surface of the semiconductor fin. The device also includes a pair of gate spacers disposed on either side of the gate structure. The device also includes an epitaxial structure disposed on either side of the pair of gate spacers in the semiconductor fin. The device also includes a contact extending vertically to physically contact the epitaxial structure, the contact further contacting a first gate spacer of the pair of gate spacers and the gate mask.

In an embodiment, a width of the gate structure at an upper surface of the gate mask is greater than the width of the gate structure at the top of the gate electrode. In an embodiment, a thickness of the gate mask is greater than a thickness of the gate electrode directly over the semiconductor fin. In an embodiment, the contact extends continuously over an upper surface of the gate mask to contact a second gate spacer of the pair of gate spacers. In an embodiment, the gate structure is a first gate structure, further including: a second gate structure including: a second gate dielectric layer, one or more second work function layers, a second gate electrode, and a second gate mask disposed over the second gate electrode, where the one or more second work function layers includes at least one work function layer including a different material than the one or more work function layers of the first gate structure. In an embodiment, a thickness of the gate mask of the first gate structure is within 5% of a thickness of the second gate mask. In an embodiment, the second gate structure has a different threshold voltage design than the first gate structure, and the contact is a self-aligned contact. In an embodiment, the device further includes a metal cap layer over the gate electrode between the gate mask and the gate electrode, the metal cap layer extending over and contacting an upper surface of the gate electrode and an upper surface of the one or more work function layers.

Another embodiment is a method including forming a fin extending from a substrate. The method also includes forming a dummy gate layer over the fin. The method also includes etching an upper portion of the dummy gate layer to form an upper portion of a dummy gate structure by a first etching process. The method also includes etching a middle portion of the dummy gate layer to form a middle portion of the dummy gate structure by a second etching process. The method also includes etching a lower portion of the dummy gate layer to form a lower portion of the dummy gate structure by a third etching process, where a width of the middle portion of the dummy gate structure is different than a width of the lower portion of the dummy gate structure.

In an embodiment, the method further includes: forming gate spacers on either side of the dummy gate structure; removing the dummy gate structure between the gate spacers to form a first opening; and depositing a replacement metal gate structure in the first opening, the replacement metal gate structure having an upper portion corresponding to the upper portion of the dummy gate structure, a middle portion corresponding to a middle portion of the dummy gate structure, and a lower portion corresponding to a lower portion of the dummy gate structure, where the middle portion of the replacement metal gate structure has a different width than the lower portion of the replacement metal gate structure. In an embodiment, the middle portion of the replacement metal gate structure has curved sidewalls forming a neck disposed between the upper portion and the lower portion. In an embodiment, during etching the replacement metal gate structure, an etch rate of the replacement metal gate structure decreases where the sidewalls of the replacement metal gate structure curve. In an embodiment, the first etching process and the second etching process each use a ratio of a first etchant to a second etchant, where a first ratio of the first etchant to the second etchant used in the first etching process is different than a second ratio of the first etchant to the second etchant used in the second etching process. In an embodiment, the second etching process and the third etching process each use a ratio of a first etchant to a second etchant, where a second ratio of the first etchant to the second etchant used in the second etching process is different than a third ratio of the first etchant to the second etchant used in the third etching process. In an embodiment, the method further includes: transitioning from the second etching process to the third etching process by adjusting the second ratio to the third ratio while continuing to etch the middle portion of the dummy gate layer. In an embodiment, etching the upper portion utilizes an etch mask, the upper portion having a same width as the etch mask, where etching the middle portion utilizes the etch mask, the etch mask being wider than the middle portion.

Another embodiment is a method including etching a dummy gate layer to form a first dummy gate in a first device region, the first dummy gate disposed over a first fin protruding from a substrate. The method also includes etching a dummy gate layer to form a second dummy gate in a second device region, the second dummy gate disposed over a second fin protruding from the substrate. The method also includes forming a first set of gate spacers on either side of the first dummy gate. The method also includes forming a second set of gate spacers on either side of the second dummy gate. The method also includes etching the first dummy gate and the second dummy gate to remove the first dummy gate and the second dummy gate, to form a first opening between the first set of gate spacers, and to form a second opening between the second set of gate spacers. The method also includes depositing a first gate structure in the first opening, the first gate structure including a first set of gate tuning layers and a first gate electrode. The method also includes depositing a second gate structure in the second opening, the second gate structure including a second set of gate tuning layers and a second gate electrode, the second set of gate tuning layers having a different material composition than the first set of gate tuning layers. The method also includes recessing the first gate structure at a first etch rate. The method also includes recessing the second gate structure at a second etch rate, the second etch rate slower than the first etch rate. The method also includes while recessing the first gate structure, reducing the first etch rate to be less than the second etch rate.

In an embodiment, the first dummy gate is etched to have a middle portion with curved sidewalls, the curved sidewalls curving toward each other to form a first neck, where reducing the first etch rate occurs when etching the first gate structure at a portion of the first gate structure corresponding to the first neck. In an embodiment, a width of a bottom surface of the gate mask is narrower than a bottom surface of the first gate structure. In an embodiment, the method further includes: forming a first dielectric layer over a first epitaxial region, the first epitaxial region adjacent to the first set of gate spacers; and etching a contact opening through the first dielectric layer, the etching using the gate mask as an etch mask to remove a portion of the first dielectric layer over the first epitaxial region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin extending from a substrate;
   forming a dummy gate layer over the fin;
   etching an upper portion of the dummy gate layer to form an upper portion of a dummy gate structure by a first etching process;
   etching a middle portion of the dummy gate layer to form a middle portion of the dummy gate structure by a second etching process;
   etching a lower portion of the dummy gate layer to form a lower portion of the dummy gate structure by a third etching process, wherein a width of the middle portion of the dummy gate structure is different than a width of the lower portion of the dummy gate structure;
   forming gate spacers on opposing sides of the dummy gate structure;
   removing the dummy gate structure between the gate spacers to form a first opening; and
   depositing a first replacement metal gate structure in the first opening, the first replacement metal gate structure having an upper portion corresponding to the upper portion of the dummy gate structure, a middle portion corresponding to the middle portion of the dummy gate structure, and a lower portion corresponding to the lower portion of the dummy gate structure, wherein the middle portion of the first replacement metal gate structure has a different width than the lower portion of the first replacement metal gate structure, wherein the middle portion forms a neck disposed between the upper portion of the first replacement metal gate structure and the lower portion of the first replacement metal gate structure; and
   etching the first replacement metal gate structure to recess an upper surface of the first replacement metal gate structure to a level at or below the neck, wherein during etching the first replacement metal gate structure, an etch rate of the first replacement metal gate structure decreases near the neck of the first replacement metal gate structure.

2. The method of claim 1, wherein the middle portion of the first replacement metal gate structure has curved sidewalls forming a neck disposed between the upper portion and the lower portion.

3. The method of claim 1, wherein the first etching process and the second etching process each use a ratio of a first etchant to a second etchant, wherein a first ratio of the first etchant to the second etchant used in the first etching process is different than a second ratio of the first etchant to the second etchant used in the second etching process.

4. The method of claim 1, wherein the second etching process and the third etching process each use a ratio of a first etchant to a second etchant, wherein a second ratio of the first etchant to the second etchant used in the second etching process is different than a third ratio of the first etchant to the second etchant used in the third etching process.

5. The method of claim 4, further comprising:
   transitioning from the second etching process to the third etching process by adjusting the second ratio to the third ratio while continuing to etch the middle portion of the dummy gate layer.

6. The method of claim 1, wherein etching the upper portion utilizes an etch mask, the upper portion having a same width as the etch mask, wherein etching the middle portion utilizes the etch mask, the etch mask being wider than the middle portion.

7. The method of claim 1, further comprising:
   depositing a second replacement metal gate structure in a second opening; and
   recessing the second replacement metal gate structure while recessing the first replacement metal gate structure, wherein the etch rate of the first replacement metal gate structure decreases relative to an etch rate of the second replacement metal gate structure.

8. The method of claim 7, wherein a height of the first replacement metal gate structure is within 5% of a height of the second replacement metal gate structure.

9. A method comprising:
   etching a dummy gate layer to form a first dummy gate in a first device region, the first dummy gate disposed over a first fin protruding from a substrate;
   etching the dummy gate layer to form a second dummy gate in a second device region, the second dummy gate disposed over a second fin protruding from the substrate;
   forming a first set of gate spacers on opposing sides of the first dummy gate;
   forming a second set of gate spacers on opposing sides of the second dummy gate;
   etching the first dummy gate and the second dummy gate to remove the first dummy gate and the second dummy gate, to form a first opening between the first set of gate spacers, and to form a second opening between the second set of gate spacers;

depositing a first gate structure in the first opening, the first gate structure comprising a first set of gate tuning layers and a first gate electrode;

depositing a second gate structure in the second opening, the second gate structure comprising a second set of gate tuning layers and a second gate electrode, the second set of gate tuning layers having a different material composition than the first set of gate tuning layers;

recessing the first gate structure at a first etch rate;
recessing the second gate structure at a second etch rate, the second etch rate slower than the first etch rate; and
while recessing the first gate structure, reducing the first etch rate to be less than the second etch rate.

10. The method of claim 9, wherein the first dummy gate is etched to have a middle portion with curved sidewalls, the curved sidewalls curving toward each other to form a first neck, wherein reducing the first etch rate occurs when etching the first gate structure at a portion of the first gate structure corresponding to the first neck.

11. The method of claim 9, further comprising:
after recessing the first gate structure, forming a gate mask over the first gate structure, wherein a width of a bottom surface of the gate mask is narrower than a bottom surface of the first gate structure.

12. The method of claim 11, further comprising:
forming a first dielectric layer over a first epitaxial region, the first epitaxial region adjacent to the first set of gate spacers; and
etching a contact opening through the first dielectric layer, the etching using the gate mask as an etch mask to remove a portion of the first dielectric layer over the first epitaxial region.

13. A method comprising:
forming a first semiconductor channel structure and a second semiconductor channel structure protruding above a substrate;
forming a dummy gate layer over the first semiconductor channel structure and the second semiconductor channel structure;
performing a plurality of etching processes on the dummy gate layer to form a first dummy gate structure over the first semiconductor channel structure and a second dummy gate structure over the second semiconductor channel structure;
forming a first set of gate spacers on opposing sides of the first dummy gate structure;
forming a second set of gate spacers on opposing sides of the second dummy gate structure;
replacing the first dummy gate structure with a first gate structure, wherein a width of a first middle portion of the first gate structure is different than a width of a first lower portion of the first gate structure and a width of a first upper portion of the first gate structure;
replacing the second dummy gate structure with a second gate structure; and
recessing the first gate structure at a first etch rate and recessing the second gate structure at a second etch rate different than the first etch rate, wherein the first etch rate decreases while recessing the first gate structure to a rate less than the second etch rate.

14. The method of claim 13, wherein the plurality of etching processes includes three separate etching processes.

15. The method of claim 13, wherein the second dummy gate structure has a different profile than the first dummy gate structure.

16. The method of claim 13, wherein a height of the first gate structure is within 5% of a height of the second gate structure.

17. The method of claim 13, further comprising:
forming a metal cap layer over the first gate structure; and
forming a gate mask over the metal cap layer.

18. The method of claim 17, wherein a thickness of the gate mask is greater than a thickness of a gate electrode of the first gate structure directly above the first semiconductor channel structure.

19. The method of claim 13, wherein the first middle portion of the first gate structure has curved sidewalls forming a neck disposed between the first upper portion and the first lower portion.

20. The method of claim 13, wherein the plurality of etching processes includes a first etching process and a second etching process, wherein the first etching process uses a first ratio of a first etchant to a second etchant, wherein the second etching process uses a second ratio of the first etchant to the second etchant, the first ratio being different than the second ratio.

\* \* \* \* \*